United States Patent
Yamanaka et al.

(10) Patent No.: US 8,659,101 B2
(45) Date of Patent: Feb. 25, 2014

(54) PHYSICAL QUANTITY DETECTOR

(75) Inventors: Kiyoko Yamanaka, Tachikawa (JP);
Kengo Suzuki, Hitachinaka (JP);
Kazunori Ohta, Hitachinaka (JP);
Heewon Jeong, Tokyo (JP); Masahide Hayashi, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/878,776

(22) PCT Filed: Oct. 7, 2011

(86) PCT No.: PCT/JP2011/005645
§ 371 (c)(1),
(2), (4) Date: Jun. 5, 2013

(87) PCT Pub. No.: WO2012/049825
PCT Pub. Date: Apr. 19, 2012

(65) Prior Publication Data
US 2013/0241013 A1    Sep. 19, 2013

(30) Foreign Application Priority Data
Oct. 15, 2010 (JP) ................ 2010-232082

(51) Int. Cl.
*B81B 3/00* (2006.01)
*G01L 9/00* (2006.01)
*H01L 29/84* (2006.01)

(52) U.S. Cl.
USPC ............. 257/420; 257/415; 257/419

(58) Field of Classification Search
USPC ............. 257/415, 419, 420
See application file for complete search history.

(56) References Cited

U.S. PATENT DOCUMENTS

| 6,988,575 | B2 * | 1/2006 | Takedomi et al. ........... 180/68.5 |
| 7,249,509 | B2 | 7/2007 | Hirano |
| 2003/0010121 | A1 | 1/2003 | Ao et al. |
| 2005/0257615 | A1 | 11/2005 | Ohta |
| 2008/0203556 | A1 * | 8/2008 | Huang ........................ 257/698 |
| 2008/0302184 | A1 * | 12/2008 | Yamaguchi et al. ....... 73/514.32 |

FOREIGN PATENT DOCUMENTS

| JP | 8-195414 A | 7/1996 |
| JP | 2003-21515 A | 1/2003 |
| JP | 2003-28644 A | 1/2003 |
| JP | 2005-33496 A | 2/2005 |
| JP | 2005-331258 A | 12/2005 |

(Continued)

OTHER PUBLICATIONS

Corresponding International Search Report with English Translation dated Nov. 29, 2011 (five (5) pages).

Primary Examiner — George Fourson, III
Assistant Examiner — Wilner Jean Baptiste
(74) Attorney, Agent, or Firm — Crowell & Moring LLP

(57) ABSTRACT

Provided is an inertial sensor device comprising a detection part having an MEMS structure, wherein convenience during sensor installation is ensured while erroneous operation caused by the application of external vibration is controlled. To achieve this objective, an anti-vibration structure (103) is provided in the inertial sensor device, between a semiconductor chip (102) mounted on a package substrate and a semiconductor chip (104) comprising a sensor detection part. The anti-vibration structure (103) has a structure in which the periphery of an anti-vibration part (103a) is surrounded by an anti-vibration part (103b) comprising a material having a larger Young's modulus.

14 Claims, 16 Drawing Sheets

(56) References Cited

FOREIGN PATENT DOCUMENTS

| JP | 2006-23190 A | 1/2006 |
| JP | 2008-70230 A | 3/2008 |
| JP | 2008-122263 A | 5/2008 |
| JP | 2008-143936 A | 6/2008 |
| JP | 2008-281586 A | 11/2008 |
| JP | 2010-185739 A | 8/2010 |
| JP | 2010-204061 A | 9/2010 |

* cited by examiner

FIG.2
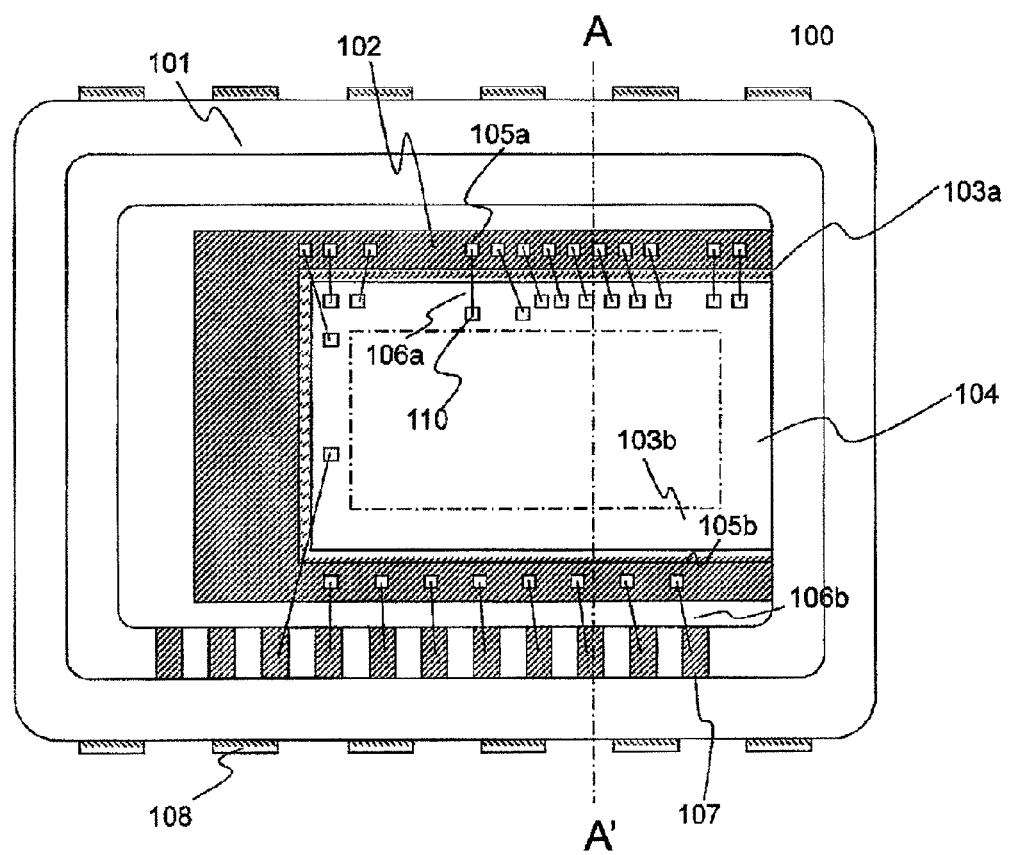
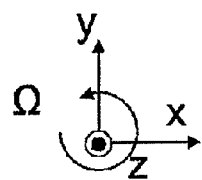

FIG.3
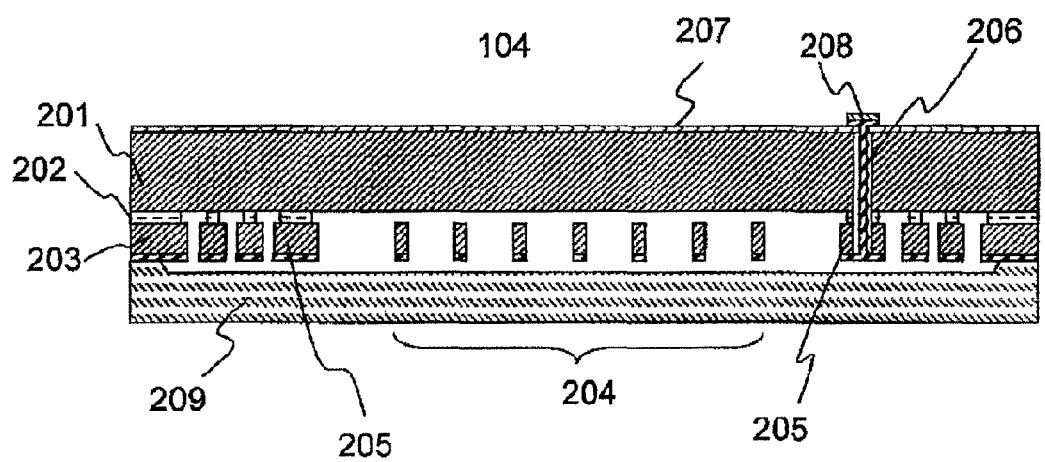
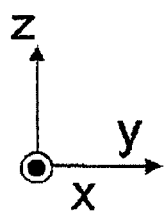

FIG.5
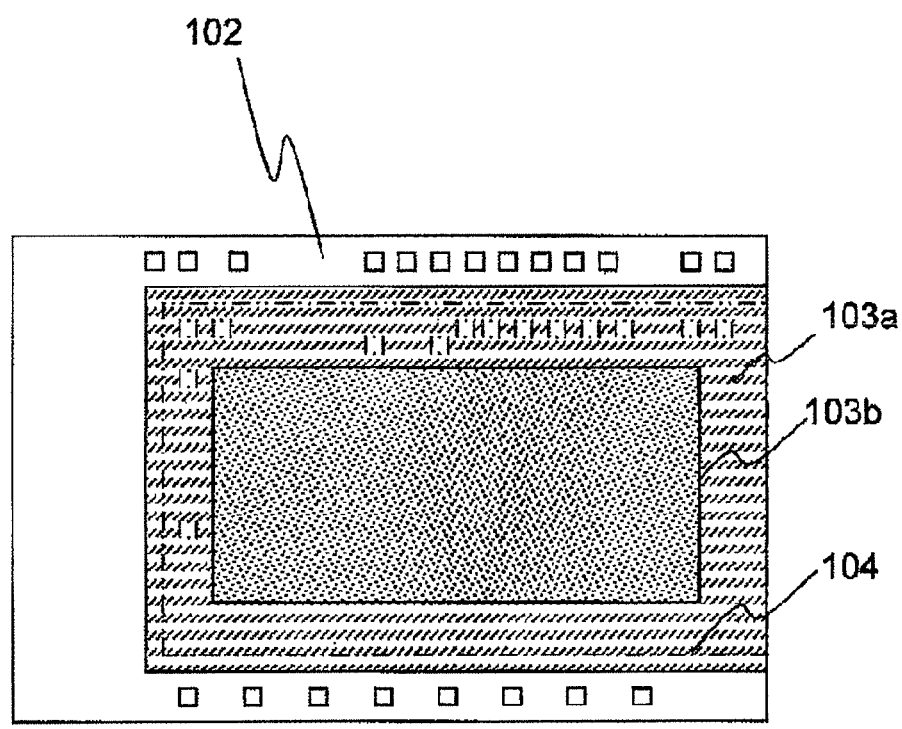
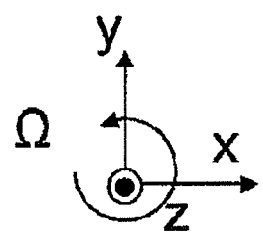

FIG.8
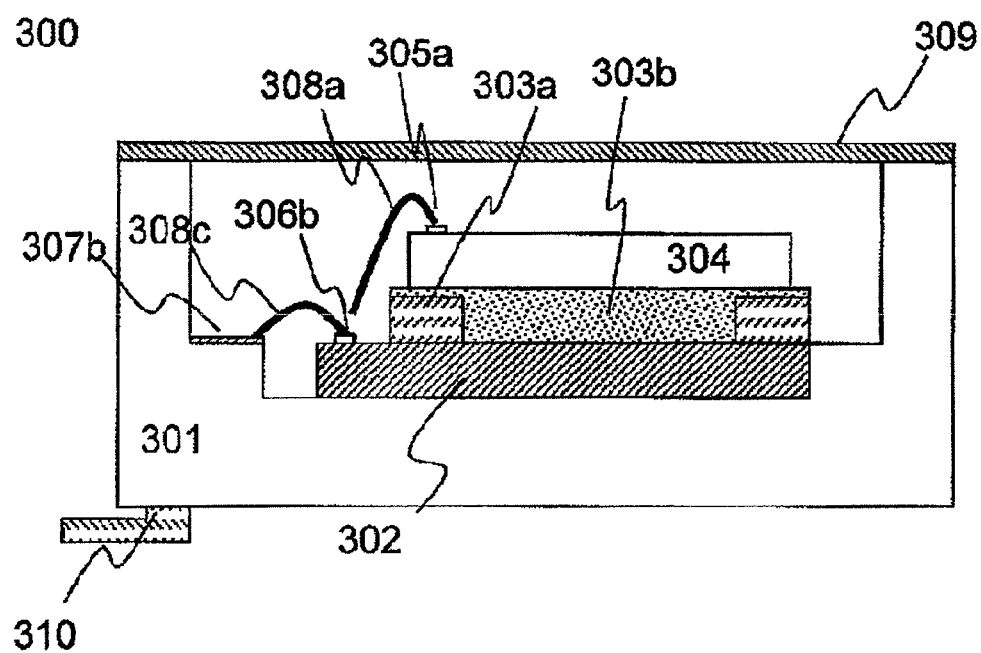
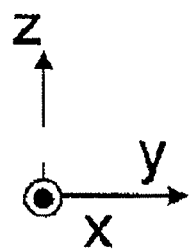

FIG.17

$$Tr = \frac{\sqrt{1+(\tan\delta)^2}}{\sqrt{\left(1-\left(\frac{f}{f_0}\right)^2\right)^2 + (\tan\delta)^2}}$$ ——— FORMULA (1)

$$f_0 = \frac{1}{2\pi}\sqrt{\frac{k}{m}}$$ ——— FORMULA (2)

PHYSICAL QUANTITY DETECTOR

TECHNICAL FIELD

This invention relates to an inertia sensor.

BACKGROUND ART

In general, the MEMS inertia sensor, which is widely used, comprises a weight (movable member) and a support beam (elastically deformable member). An acceleration sensor is the device in which the weight is supported by the support beam movable along a certain linear axis defined relative to the substrate on which such an MEMS inertia sensor is formed and in which the displacement of the weight due to the acceleration exerted on to the substrate is converted to a corresponding electric signal by means of an LSI circuit. On a substrate where an MEMS inertia sensor is formed, a weight is supported by a support beam movable along both a first axis and a second axis defined perpendicular to each other; the substrate as a whole is rotated about a third axis perpendicular to the substrate while the weight is being vibrated along the first axis by means of a vibration generating unit; and then the weight vibrating along the first axis comes to move in the direction of the second axis due to the Coriolis force generated due to the rotational force. The angular velocity sensor is that which converts the displacement of the weight to an electric signal by means of an LSI circuit.

These inertia sensors have a common feature that a weight serves as a sensing element of the sensor. Since this weight is a mechanical element, it may be displaced even when acceleration other than a signal to be measured is exerted thereto. And such an unwanted displacement of the weight may be converted to an electric signal by the LSI circuit so that the resulted electric signal becomes noise, which deteriorates the measurement precision of the inertia sensor. In another case where such an electric signal has a magnitude that is beyond the measurable range of the LSI circuit, that is, where the LSI circuit saturates, the electric signal may cause a dysfunction of the inertia sensor as a result of the signal to be detected being mixed into the saturated signal.

In order to suppress such an erroneous operation of the inertia sensor due to acceleration other than a signal to be measured and such a dysfunction thereof due to an erroneous output, it suffices to prevent the detecting element from mechanically responding to acceleration other than a signal to be measured. Accordingly, it is desired that a vibration-proof structure is fabricated in such a manner that vibration-proof parts for preventing the acceleration other than a signal to be measured from being transmitted to the inertia sensor via the substrate on which the inertia sensor is mounted should be interposed between the inertia sensor and the substrate on which the inertia sensor is mounted.

The vibration transmissibility of the vibration-proof structure is given by Tr (%) of the formula (1) in FIG. 17. Therefore, in order to decrease the value of the vibration transmissibility Tr (%) of the vibration-proof structure for the purpose of suppressing the transmission of acceleration other than a signal to be measured to the detecting element of the inertia sensor, it is necessary to lower the characteristic frequency of vibration f0 (Hz) of the vibration-proof structure provided between the inertia sensor and the substrate on which the inertia sensor is mounted.

It is to be noted here that the characteristic frequency of vibration f0 (Hz) is given by the formula (2) in FIG. 17. Accordingly, in order to lower the characteristic frequency of vibration f0 (Hz) of the vibration-proof structure in the sensor wherein the sensor substrate as a sensing member is integrally mounted in the packaging member, it is primarily considered to increase the mass m (kg) of the vibration-proof structure as a whole. However, in the sensor wherein the sensor substrate as a sensing member is integrally mounted on the packaging member, there is a limitation of space within the packaging member, and the increase in the dimensions of the substrate constituting the sensing member of the sensor amounts to the increase in the dimensions of the sensor as a whole. This is not desirable from the standpoint of production cost or usability of the sensor. Further, if the material of the substrate serving as the detecting element of the sensor is to be substituted for another material having larger density, the process of manufacturing the sensor must be changed. This is undesirable since the time required for development is prolonged, causing the increase in cost. It is therefore difficult to employ the method of increasing the mass of the vibration-proof structure.

An alternative method may be considered that decreases the modulus of elasticity k (N/m) of vibration-proof structure so that the characteristic frequency of vibration f0 (Hz) of the vibration-proof structure given by the formula (2) can be lowered in the sensor wherein the sensor substrate as a sensing member is integrally mounted on the packaging member. Concerning this method, the following techniques have been proposed.

CITATION LIST

Patent Literature

Patent Literature 1: JP-A-2003-028644
Patent Literature 2: JP-A-2005-331258

SUMMARY OF INVENTION

Technical Problem

The Patent Literature 1 proposes a method according to which the structure having the angular velocity detecting unit mounted on the packaging member with adhesive agent that has a low Young's modulus interposed between them is formed so that the degradation of precision in detection due to the exertion of external acceleration can be prevented. The Patent Literature 2 proposes a method according to which the structure having the angular velocity detecting unit mounted on the packaging member with adhesive film interposed between them is formed, the characteristic frequency of the structure is lowered by adjusting the shape or the modulus of elasticity of the adhesive film, and the degradation of precision in detection due to the exertion of external acceleration can be prevented.

However, in the attempt to lower the characteristic frequency of the vibration-proof structure having the sensing unit of the sensor mounted on the packaging member with the adhesive agent having a low Young's modulus interposed between them, the smaller is the Young's modulus, the lower is the viscosity before curing. As a result, the adhesive agent flows out of the place due to its low viscosity. This gives rise to a problem that a proper amount of adhesive cannot be applied to a desired place.

Further, if the vibration-proof structure having the detecting unit of the sensor mounted on the packaging member by interposing between them the adhesive agent having a low Young's modulus is employed where the sensor substrate is electrically connected with the LSI circuit board by using wire-bonding process after the sensor substrate has been mounted onto the packaging member, then vibration transmission necessary for wire-bonding becomes impossible between the sensor substrate and the packaging member, leading to failure in making electric connection. This results from the fact that wire-bonding is the technique of joining two metal pieces by applying ultrasonic vibration of about 60 kHz~100 kHz to the metal pieces to be electrically connected while heat and pressure are being applied to the joined spots of the wiring metal and the metal pad of the sensor substrate.

Furthermore, in the case where the vibration-proof structure having the detecting unit of the sensor mounted on the packaging member by interposing between them the adhesive film is formed so that the characteristic frequency of the structure can be lowered by adjusting the shape or the modulus of elasticity of the film, if the shape is too small, the area necessary for automatic transfer of the film becomes unavailable, and this leads to a problem that utility in mounting becomes degraded. Moreover, in the case where a film having low modulus of elasticity is used, it becomes impossible to automatically transfer the film while the shape thereof is maintained invariable. This also leads to a problem that convenience in mounting becomes degraded.

The object of this invention is to provide a technique which can suppress by lowering the characteristic frequency of the vibration-proof structure the transfer to the detecting unit of the inertia sensor of such accelerating vibration other than a signal to be measured as may cause the degradation of sensor precision and the dysfunction of sensor due to erroneous outputs, and which can still maintain convenience in mounting.

Solution to Problem

Of solutions to problem, according to this invention, a typical example described in this specification is an inertia sensor comprising: a packaging member; a first semiconductor chip having a substrate and a detecting unit of sensor comprising weights displaceable relative to the substrate and detecting electrodes for converting the displacements of the weights to electric signals, the detecting unit of sensor being mounted on the substrate; a second semiconductor chip mounted on the packaging member so as to perform arithmetic operations on the electric signals; and a vibration-proof structure having a first vibration-proof part and a second vibration-proof part made of material having a larger Young's modulus than the first vibration-proof part, the vibration-proof structure being disposed between the first semiconductor chip and the second semiconductor chip, wherein the periphery of the first vibration-proof part is surrounded by the second vibration-proof part or the combination of the second vibration-proof part and the packaging member.

Of solutions to problem, according to this invention, another typical example described in this specification is an inertia sensor comprising: a packaging member; a first semiconductor chip including a substrate, a first sensor unit formed on the substrate for outputting a first electric signal and a second sensor unit formed on the substrate for outputting a second electric signal; a second semiconductor chip including a computing circuit for performing arithmetic operation on the first electric signal and the second electric signal; and a vibration-proof structure disposed between the first and second semiconductor chips and including a first vibration-proof part and a second vibration-proof part which has a larger Young's modulus than the first vibration-proof part, wherein the first sensor unit includes: a first weight that can vibrate in a first direction parallel to the surface of the substrate; and a first detecting electrode for converting the displacement of the first weight in a second direction to a first electric signal when the substrate is rotated about a third direction along an axis perpendicular to the surface of the substrate, the second direction being parallel to the surface of the substrate and perpendicular to the first direction; wherein the second sensor unit includes: a second weight that can vibrate in the first direction; and a second detecting electrode for converting the displacement of the second weight in the first direction to a second electric signal when acceleration is applied in the first direction; wherein the periphery of the first vibration-proof part is surrounded by the second vibration-proof part or the combination of the second vibration-proof part and the packaging substrate; and wherein the structure including the first vibration-proof part and the second vibration-proof part is such that the characteristic frequency in the first direction or the characteristic frequency in the second direction is different in the first sensor and the second sensor.

Advantageous Effects of Invention

This invention enables enhancing the precision of and the convenience in mounting of, an inertia sensor.

BRIEF DESCRIPTION OF DRAWINGS

FIG. 2 shows in plan view the structure of an angular velocity sensor in its mounted state, according to the first embodiment of this invention;

FIG. 3 shows in cross section the detection chip of an angular velocity sensor according to the first embodiment of this invention;

FIG. 5 shows in plan view the structure of an angular velocity sensor in its mounted state, according to the first embodiment of this invention;

FIG. 8 shows in cross section the structure of a combined sensor in its mounted state, according to a second embodiment of this invention;

FIG. 17 gives the formulae for vibration transmissibility and characteristic frequency.

DESCRIPTION OF EMBODIMENTS

Embodiment 1

The first embodiment of this invention exemplifying an inertia sensor used as an angular velocity sensor is described below in reference to the attached drawings.

Figure 1:
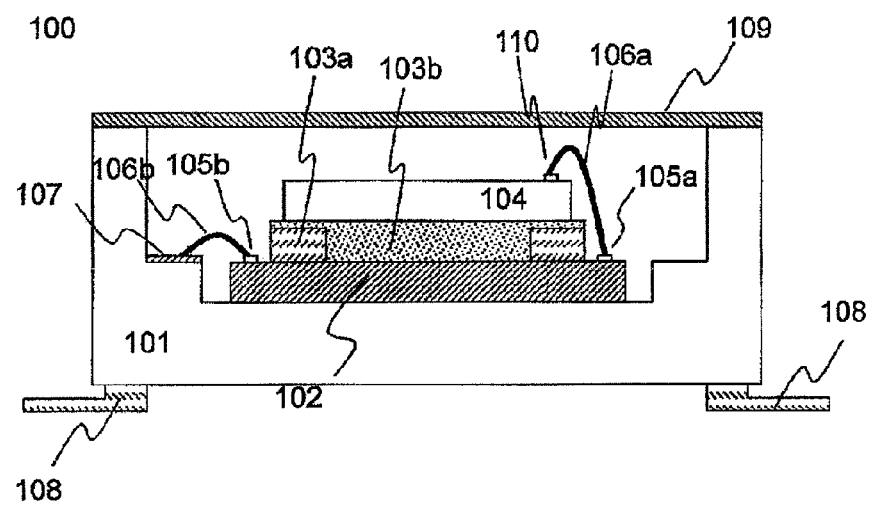
FIG. 1 shows in cross section the structure of an angular velocity sensor in its mounted state, according to a first embodiment of this invention.

FIG. 1 shows in cross section the structure of an angular velocity sensor 100 in its mounted state, according to a first embodiment of this invention.

As shown in FIG. 1, a semiconductor chip 102 is mounted on the bottom of the depressed area of a packaging member 101. The packaging member 101 may be made of, for example, ceramic. In the semiconductor chip 102 are formed transistors and integrated circuits having passive elements. The integrated circuit formed in the semiconductor chip 102 has the function of processing the output signal of the detecting unit of the angular velocity sensor and finally outputs an angular velocity signal.

A semiconductor chip 104 is mounted on the semiconductor chip 102, with a vibration-proof structure comprising a vibration-proof part 103a and a vibration-proof part 103b, interposed between them. The vibration-proof part 103a, formed as a frame surrounding the vibration-proof part 103b, is made of, for example, silicon rubber sheet. That part of the vibration-proof part 103b which is surrounded by the vibration-proof part 103a and is in contact with the semiconductor chip 104, is made of liquid having a high fluidity or its cured version such as, for example, silicon adhesive agent or silicon gel. It is to be noted that since the vibration-proof part 103a serves as a frame for enclosing material 103b of high fluidity, the material for the vibration-proof part 103a has a lager Young's modulus than that of the vibration-proof part 103b. The vibration-proof part 303b having high fluidity is excessively charged into the frame of the vibration-proof part 103a and penetrate into the thin gap between the vibration-proof part 103a and the semiconductor chip 104 due to the surface tension of the vibration-proof part 103b. An MEMS structure for constituting an angular velocity sensor is formed on the semiconductor chip 104. A pad 110 formed on the semiconductor chip 104 is connected with a pad 105a formed on the semiconductor chip 102 via, for example, metal wire 106a. Further, the pad 105b formed on the semiconductor chip 102 is connected with a terminal 107 formed on the packaging member 101 via metal wire 106b and also with a terminal 108 extending externally of the packaging member 101 via internal wiring within the packaging member 101. Still further, the semiconductor chips 102 and 104, which are stuck one upon another in the packaging member 101, are hermetically sealed in the packaging member 101 by hermetically covering the upper portion of the packaging member 101 with a lid 109.

FIG. 2 shows in plan view the structure of the angular velocity sensor in its mounted state, according to the first embodiment of this invention. The cross section taken along dashed line A-A in FIG. 2 corresponds to FIG. 1. The lid for hermetically sealing the packaging member is not shown in FIG. 2.

On the bottom of the hollow packaging member 101 is mounted the semiconductor chip 102, on which the semiconductor chip 104 is mounted with the vibration-proof parts 103a and 103b interposed between the semiconductors 102 and 104. The vibration-proof part 103a, formed as a frame encircling the vibration-proof part 103b, is made of, for example, silicon rubber sheet. That part of the vibration-proof material 103b which is encircled by the vibration-proof part 103a and is in contact with the semiconductor chip 104, is made of liquid having a high fluidity or its cured version such as, for example, silicon adhesive agent or silicon gel. It is to be noted that since the vibration-proof part 103a serves as a frame for enclosing material 103b of high fluidity, the material for the vibration-proof part 103a has a lager Young's modulus than that of the vibration-proof part 103b. The MEMS structure for detecting angular velocity is formed on the semiconductor chip 104.

The pad 110 formed on the semiconductor chip 104 is connected with the pad 105a formed on the semiconductor chip 102 via the metal wire 106a. Further, the pad 105a formed on the semiconductor chip 102 is connected with the terminal 107 formed on the packaging member 101 via the metal wire 106b and also with the terminal 108 extending externally of the packaging member 101 via the internal wiring. And the semiconductor chips 102 and 104, which are stuck one upon another in the packaging member 101, are hermetically sealed in the packaging member 101 by hermetically covering the upper portion of the packaging member 101 with the lid 109 (not shown).

The shapes of the vibration-proof part 103a and the vibration-proof part 103b formed on the semiconductor chip 102 are shown as a box delineated with broken line in FIG. 2, or FIG. 3. With respect to the pad 110 on the semiconductor chip 104, the frame of the vibration-proof part 103a extends perpendicular to the surface of the drawings. It is to be noted here that since the vibration-proof part 103a serves as a frame for enclosing the material 103b of high fluidity, the material for the vibration-proof part 103a has a lager Young's modulus than that for the vibration-proof part 103b. With this structure, when wire bonding process for electric connection is performed after the semiconductor chips 102 and 104 have been mounted on the packaging member 101, the transfer of vibration, which is necessary for wire bonding, can be secured in the direction perpendicular to the surface of the drawing.

FIG. 3 shows in cross section the details of the semiconductor chip 104 on which the MEMS structure of the angular velocity sensor as the first embodiment of this invention is formed, the MEMS structure serving to detect angular velocity. In the semiconductor chip 104, the movable part 204 and the fixed part 205 of the MEMS structure are formed on an SOI substrate constructed with a support substrate 201, an insulating oxide film 202 and a silicon activated layer 203, by using such techniques as photolithography and DRIE (Deep Reactive Ion Etching). And the movable part 204 and the fixed part 205 of the MEMS structure are protected by a glass cap 209 joined to the silicon activated layer 203 by using such a technique as anodic junction or surface activation junction. Further, the movable part 204 and the fixed part 205 of the MEMS structure are electrically connected with a pad 208 formed on the rear surface of the support substrate 201 via a penetration electrode material 206 that penetrates the support substrate 201, and further connected via bonding wire to an integrated circuit having the function of processing the output of the detection unit of the angular velocity sensor.

Figure 4:
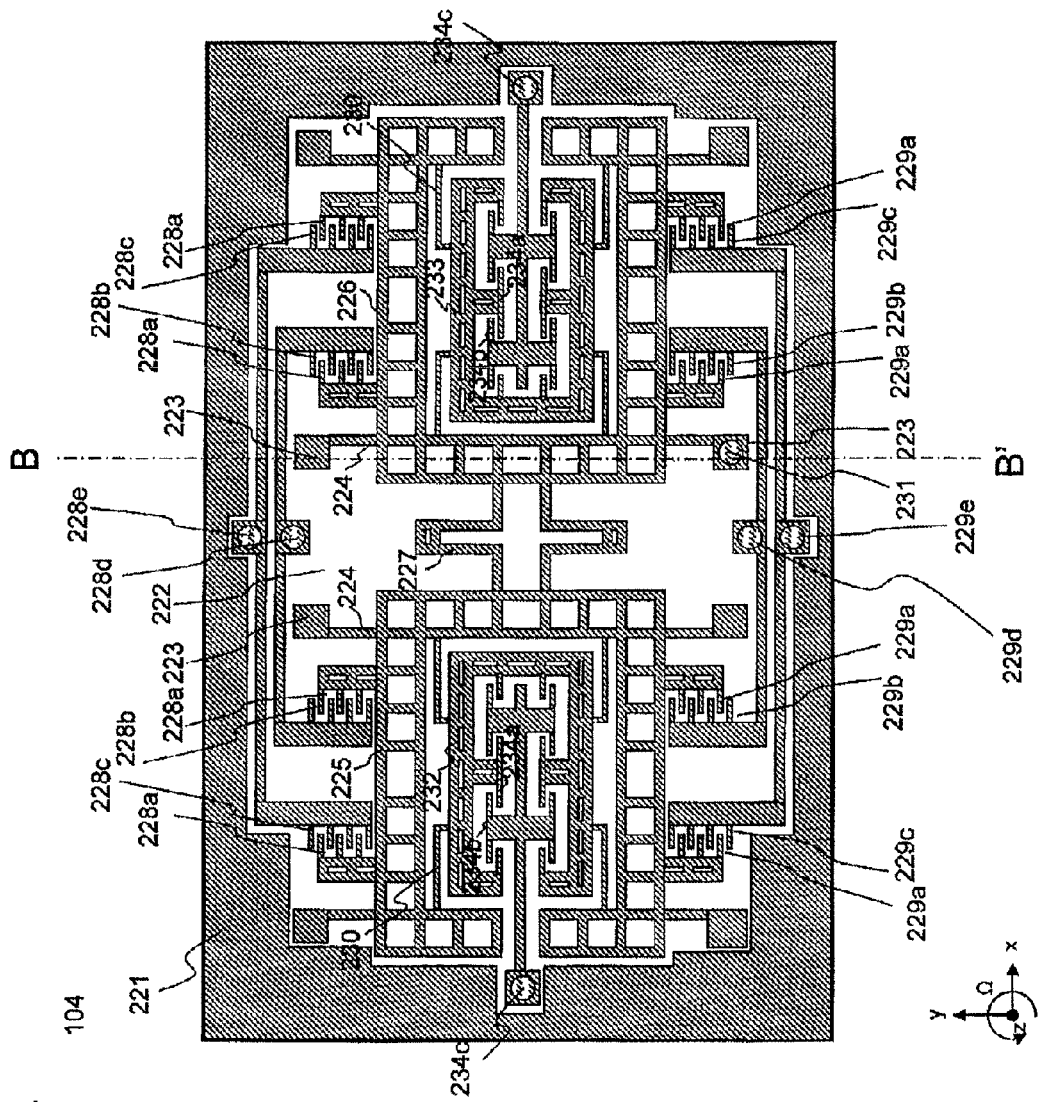
FIG. 4 shows in plan view the detection chip of an angular velocity sensor according to the first embodiment of this invention.

FIG. 4 shows in plan view the details of the semiconductor chip 104 on which the MEMS structure for detecting the angular velocity, of the angular velocity sensor according to the first embodiment of this invention is mounted. In this case, plan view is meant to be a view taken of the MEMS structure from the side of the glass cap 209 in FIG. 3. Also, the cross section taken along broken line B-B corresponds to FIG. 3.

A hollow space 222 is surrounded by a frame member 221, and a fixed part 223 is formed within the hollow space 223. A beam (elastically deformable member) 224 is mechanically coupled to the fixed part 223. The beam 224 is mechanically coupled to two movable parts 225 and 226 which serve as vibratory elements constituting the weights of the angular velocity sensor. In fact, the movable parts 225 and 226 that are two vibratory elements are coupled to the fixed part 223 by means of the elastically deformable beam 224 so that the movable parts 225 and 226 constituting the vibratory elements can be displaced in the x-direction shown in FIG. 4. Also, the movable parts 225 and 226 constituting the vibratory elements are coupled with each other with a linking beam 227 so that they can share their respective vibration energies to form a tuning fork vibration system.

Driving movable electrodes 228a are formed integrally with the movable parts 225 and 226 constituting the vibratory elements, and driving fixed electrodes 228b and 228c are disposed opposite to the driving movable electrodes 228a. A periodic driving signal represented by Vcom+Vb+Vd is applied between the driving movable electrodes 228a and the driving fixed electrodes 228b which are disposed opposite to each other to form capacitive elements; a periodic driving voltage represented by Vcom+Vb−Vd is applied between the driving movable electrodes 228a and the driving fixed electrodes 228c; and a voltage Vcom is applied to the movable parts 225 and 226 which constitute vibrating elements. Accordingly, since electrostatic force is generated between the driving movable electrodes 228a and the driving fixed electrodes 228b and between the driving movable electrodes 228a and the driving fixed electrodes 228c, then the driving movable electrodes 228a are brought to vibration. When the driving movable electrodes 228a vibrate in the direction of the x-axis, the movable parts 225 and 226, which are formed integrally with the driving movable electrodes 228a and serve as the vibrating elements, vibrate in opposite phases. That is to say, the capacitive elements made of the driving movable electrodes 228a and the driving fixed electrodes 228b or of the driving movable electrodes 228a and the driving fixed electrodes 228c function as forced vibration generating units that cause the movable parts 225 and 226 serving as vibrating elements to be forcibly vibrated in opposite phases in the direction of the x-axis.

Drive amplitude monitoring movable electrodes 229a are formed integrally with the movable parts 225 and 226 serving as vibrating elements, and drive amplitude monitoring fixed electrodes 229b and 229c are formed opposite to the drive amplitude monitoring movable electrodes 229a. The combination of the drive amplitude monitoring movable electrodes 229a and the drive amplitude monitoring fixed electrodes 229b and the combination of the drive amplitude monitoring movable electrodes 229a and the drive amplitude monitoring fixed electrodes 229c, form capacitive elements respectively. When the movable parts 225 and 226 serving as vibrating elements are displaced in the direction of the x-axis due to electrostatic forces acting between the driving movable electrodes 228a and the driving fixed electrodes 228b and between the driving movable electrodes 228a and the driving fixed electrodes 228c, the capacitances of the capacitive elements are changed. In fact, the capacitive elements constructed with the drive amplitude monitoring movable electrodes 229a and the drive amplitude monitoring fixed electrodes 229b and with the drive amplitude monitoring movable electrodes 229a and the drive amplitude monitoring fixed electrodes 229c, function as capacitance detecting units for detecting the displacement in the x-direction of the movable parts 225 and 226 serving as vibrating elements as changes in capacitance.

The movable parts 225 and 226 serving as vibrating elements are mechanically coupled via beams 230 to movable parts 232 and 233 serving as detecting elements, respectively. Angular velocity detecting movable electrodes 234a are formed integrally with the movable parts 232 and 233 serving as detecting elements, and angular velocity detecting fixed electrodes 234b are formed opposite to the angular velocity detecting movable electrodes 234a. These angular velocity detecting movable electrodes 234a and angular velocity detecting fixed electrodes 234b form capacitive elements. When the substrate as a whole is rotated about the z-axis perpendicular to the substrate, the Coriolis force whose magnitude depends on the generated rotational force causes the movable parts 232 and 233 serving as detecting elements to be displaced in the y-direction so that the capacitances of the above mentioned capacitive elements change accordingly. In fact, the capacitive elements constituted of the angular velocity detecting movable electrodes 234a and angular velocity detecting fixed electrodes 234b function as capacitance detecting units for detecting the displacement in the y-direction of the movable parts 232 and 233 serving as detecting elements as change in capacitance.

The capacitance changes occurring in the respective electrode pairs are electrically transferred to the rear surface of the semiconductor chip 104 via penetration electrodes 228d, 228e, 229d, 229e, 231 and 234c, and further transferred via bonding wires to the integrated circuit which has the function of processing the output of the angular velocity detecting unit.

It is to be noted here that although the semiconductor chip 104 was supposed to be fabricated by using an SOI substrate and such techniques as photolithography and DRIE (Deep Reactive Ion Etching), the semiconductor chip 104 can also be fabricated by the bulk MEMS process which forms an MEMS structure by working on both sides of a silicon substrate through the use of techniques for joining glass and silicon, and hence making a glass-silicon-glass junction. Further, the semiconductor chip 104 can likewise be fabricated by the surface MEMS process which forms an MEMS structure by depositing thin films on the surface of a silicon substrate on which signal processing circuits such as transistors are previously formed and by repeating patterning of the deposited thin films.

In this way, the mounting on the silicon substrate of the angular velocity sensor as an inertia sensor according to the first embodiment of this invention is completed.

As for the angular velocity sensor as an inertia sensor according to the first embodiment of this invention, when the substrate as a whole is rotated about the third axis perpendicular to the substrate with respect to the semiconductor chip on which the angular velocity detecting unit in the form of the MEMS structure are formed, the Coriolis force whose magnitude depends on the generated rotational force causes the weight vibrating in the direction of the first axis (i.e. in the x-direction in FIG. 2) to be displaced in the direction of the second axis (i.e. in the y-direction in FIG. 2). The displacement of the weight is transferred as an electric signal to the semiconductor chip 102, the transferred signal is processed by the integrated circuit formed in the semiconductor chip 102, and finally an angular velocity signal is delivered.

With the above described angular velocity sensor, except when a rotational force is applied to the semiconductor chip 104 on which the angular velocity detecting unit in the form of the MEMS structure is formed and even when acceleration is applied in the direction of the second axis (i.e. in the y-direction in FIG. 2), the weight vibrating in the direction of the first axis (i.e. in the x-direction in FIG. 2) due to the acceleration is caused to be displaced in the direction of the second axis (i.e. in the y-direction in FIG. 2). Then, the displacement of the weight is transferred as an electric signal to the semiconductor chip 102, and the transferred signal is processed by the integrated circuit formed in the semiconductor chip 102. That is to say, even when the sensor substrate as a whole is not rotated about the third axis perpendicular to the substrate, the angular velocity sensor detects the displacement of the weight as caused by the acceleration if any acceleration is applied in the direction of the second axis (i.e. in the y-direction in FIG. 2). In this way, when acceleration is applied in the direction of the second axis (i.e. in the y-direction in FIG. 2) with respect to the substrate of the angular velocity sensor, the displacement of the weight as caused by the acceleration is included as noise so that the precision in detecting angular velocity is thought to be degraded.

Figure 6:
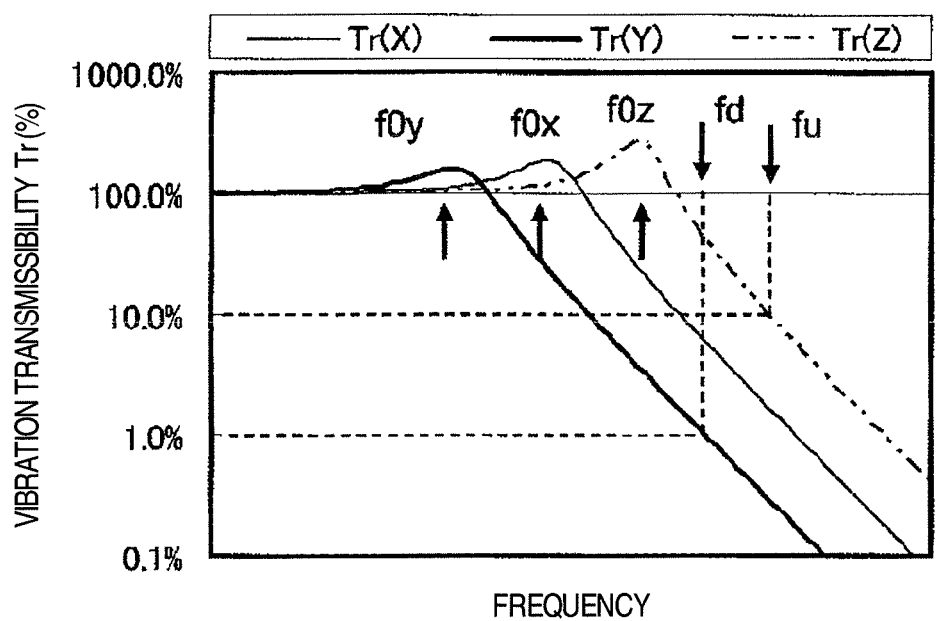
FIG. 6 shows the vibration transmissibility in the vibration-proof structure of an angular velocity sensor according to the first embodiment of this invention.

However, the angular velocity sensor as the first embodiment of this invention is made in the form of the semiconductor chip 104 comprising the vibration-proof part 103a, the vibration-proof part 103b and the MEMS structure serving as the angular velocity detecting unit, as shown in FIG. 5. The characteristic frequency of the overall structure as the semiconductor chip 104 comprising the vibration-proof part 103a, the vibration-proof part 103b and the MEMS structure serving as the angular velocity detecting unit, as shown in FIG. 5 can be calculated through structural computation using the finite element method, for example. Let the semiconductor chip 104 made of silicon substrate have its areal dimensions of 4 mm×6 mm and its thickness of 0.5 mm, and let the vibration-proof part 103a be made of silicon rubber sheet having its Young's modulus of 5 MPa (Hardness 40) and the vibration-proof part 103b be made of silicon adhesive agent having its Young's modulus of 0.1 MPa. Then, the characteristic frequencies f0i (i=x, y, z) of the structure in the directions of the respective axes are such that f0y<f0x<f0z. In this case, the frequency dependence of the vibration transmissibility of the structure can be calculated as shown in FIG. 6 by using the formula (1). It is to be noted here that if the frequency detected by the angular velocity detecting units in the form of the MEMS structure is assumed to be fd, the characteristic frequency of the structure in the direction of the y-axis is determined by adjusting the thicknesses of the vibration-proof parts 303a and 303b in such a manner that the vibration transmissibility in the second axis (in the y-direction in FIG. 9) along which detection takes place, at the frequency fd meets a desired target value. With the structure of the semiconductor chip 104 comprising the vibration-proof part 103a, the vibration-proof part 103b and the angular velocity detecting units in the form of the MEMS structure, as shown in FIG. 5, the vibration transmissibility in the direction of the y-axis can be set low while the vibration transmissibility in the directions other than along the y-axis are not simultaneously kept low. Further, the transmission of vibration in the z-direction can also be secured where the frequency of ultrasonic vibration is chosen to be fu, the ultrasonic vibration being used in wire bonding process performed to make electric connections after the semiconductor chip 102 and the semiconductor chip 104 have been mounted on the packaging member 101.

Consequently, even when accelerating vibration unwanted for measurement is applied via the vibration-proof part 103a and the vibration-proof part 103b shown in FIG. 5 to the angular velocity sensor as a whole that is an inertia sensor as the first embodiment of this invention, the structure of this angular velocity sensor prevents such accelerating vibration from being transmitted to the substrate 104 having the angular velocity detecting units in the form of the MEMS structure mounted thereon and hence the output precision of the angular velocity sensor from being degraded.

As described above, this embodiment of the invention comprises: a packaging member (101); a semiconductor chip (104) having a substrate (201) and a detecting unit of sensor comprising weights (movable parts 225, etc.) displaceable relative to the substrate and detecting electrodes (movable electrodes 228a and fixed electrodes 228b, etc.) for converting the displacements of the weights to electric signals, the detecting unit of sensor being mounted on the substrate; a semiconductor chip (102) mounted on the packaging member so as to perform arithmetic operations on the electric signals; and a vibration-proof structure having a first vibration-proof part (103b) and a second vibration-proof part (103a) made of material having a larger Young's modulus than the first vibration-proof part, the vibration-proof structure being disposed between the semiconductor chips, wherein the periphery of the first vibration-proof part is surrounded by the second vibration-proof part. With this structure, the vibration-proof structure can be made of soft, difficult-to-handle material having a small Young's modulus such as silicon adhesive agent that has fluidity before curing or silicon gel, and therefore convenience in mounting can be improved. In addition, the vibration transmissibility of the vibration-proof structure can be reduced even in the limited packaging space, and this can lead to the improvement in the precision of the inertia sensor.

In addition, by superposing the projections of the bonding pads on the second vibration-proof part in the direction perpendicular to the surface of the substrate, the vibration transmissibility of the vibration-proof structure can be lowered, and at the same time the ultrasonic vibration required for electrically connecting the semiconductor chip 104 with the signal processing semiconductor chip 102 by using wire bonding can be properly transmitted, so that convenience in mounting can be secured.

Further, the structure shown in FIG. 5 where the vibration-proof part 103a, which is rather hard and has a relatively large Young's modulus, surrounds the vibration-proof part 103b, which has a relatively small Young's modulus, is not only a limited example according to this invention. But such structures as shown in Parts (a)~(c) of FIG. 7 can also provide that vibration-proof effect which can be achieved by the first embodiment described above. That is to say, a first vibration-proof part has only to be surrounded by a second vibration-proof part or the combination of the second vibration-proof part and a packaging member. By employing these kinds of structures, the improvement in precision can be compatible with the improvement in convenience in mounting, as explained above.

Figure 7:
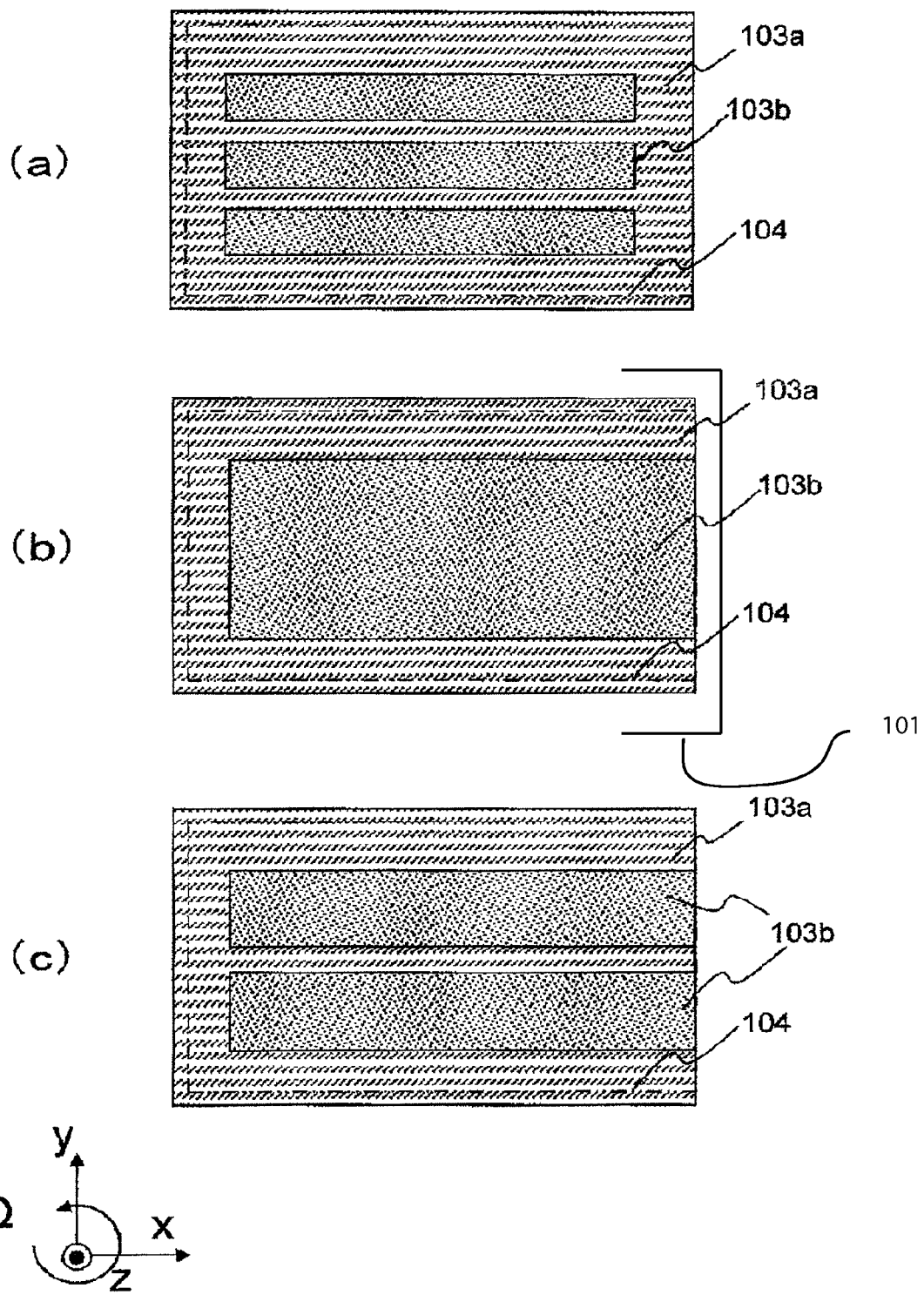
FIG. 7 shows in another plan view the structure of an angular velocity sensor in its mounted state, according to the first embodiment of this invention.

Above all, the structures shown in FIG. 5 and Part (a) of FIG. 7 are characterized in that the shape of the first vibration-proof part is a rectangle having its long side along a first direction (e.g. x-direction) and its short side along a second direction (e.g. y-direction). This feature can make the characteristic frequencies in the directions along the x-axis and y-axis of the vibration-proof structure comprising the vibration-proof part 103a, the vibration-proof part 103b and the semiconductor chip 104, different from each other. In fact, the vibration applied to the angular velocity sensor can be transmitted via the sensor package, the semiconductor chip 102, the vibration-proof part 103a and the vibration-proof part 103b to the semiconductor chip 104 with different vibration transmissibilities according as the vibration is transmitted in the direction of the x-axis or in the direction of the y-axis. To be concrete, the transmissibility in the direction of the y-axis can be made smaller than that in the direction of the x-axis. Accordingly, with this structure, vibrations through the semiconductor chip 104 are less easily transmitted in the direction of the y-axis than in the direction of the x-axis.

The structures shown in Part (a) of FIG. 7 and Part (c) of FIG. 7 are characterized in that the first vibration-proof part is divided into plural sub-parts by the second vibration-proof part. According to this feature, the characteristic frequencies in the directions along the x-axis and y-axis of the vibration-proof structure comprising the vibration-proof part 103a, the vibration-proof part 103b and the semiconductor chip 104 can be adjusted to desired values. Consequently, although vibrations through the semiconductor chip 104 are less easily transmitted in the direction of the y-axis than in the direction of the x-axis, the transmissibility in the direction of the y-axis can be adjusted.

Each of the structures shown in Part (b) of FIG. 7 and Part (c) of FIG. 7 is characterized in that one of the sides of the first vibration-proof part is in contact with the packaging member and the other sides are surrounded by the second vibration-proof part. With this feature, the ratio of the area where the vibration-proof part 103b having a small Young's modulus is disposed to the area where the vibration-proof part 103a having a larger Young's modulus is disposed, can be increased. As a result, the characteristic frequency of the vibration-proof structure in this case, comprising the vibration-proof part 103a, the vibration-proof part 103b and the semiconductor chip 104 can be adjusted lower than that of the vibration-proof structure wherein no side of the first vibration-proof part is in contact with the packaging member. In fact, the vibration transmissibility of the vibration-proof structure wherein one of the sides of the first vibration-proof part is in contact with the packaging member, can be made smaller than that of the vibration-proof structure wherein no side of the first vibration-proof part is in contact with the packaging member.

Embodiment 2

The second embodiment of this invention exemplifying an inertia sensor specified as a compound sensor configured with an angular velocity sensor for detecting angular velocity along a single axis and acceleration sensors for detecting accelerations along two axes, is described below in reference to the attached drawings.

FIG. 8 shows in cross section the structure of a compound sensor 300 in its mounted state, according to a second embodiment of this invention.

As shown in FIG. 8, a semiconductor chip 302 is mounted on the bottom of the depressed area of a packaging member 301. The packaging member 301 may be made of, for example, ceramic. In the semiconductor chip 302 are formed transistors and integrated circuits having passive elements. The integrated circuit formed in the semiconductor chip 302 has the functions of processing the output signal of the detection unit of the angular velocity sensor and the output signals of the detection units of the acceleration sensors, and finally outputs an angular velocity signal and acceleration signals.

A semiconductor chip 304 is mounted on the semiconductor chip 302, with a vibration-proof part 303a and a vibration-proof part 303b interposed between them. The vibration-proof part 303a, formed as a frame surrounding the vibration-proof part 303b, is made of, for example, silicon rubber sheet. That part of the vibration-proof part 303b which is surrounded by the vibration-proof part 303a and is in contact with the semiconductor chip 304, is made of liquid having a high fluidity or its cured version such as, for example, silicon adhesive agent or silicon gel. It is to be noted here that since the vibration-proof part 303a serves as a frame for confining material 303b of high fluidity within, the material for the vibration-proof part 303a has a lager Young's modulus than that of the vibration-proof part 303b. The vibration-proof part 303b having high fluidity is excessively charged into the frame made of the vibration-proof part 303a and penetrates into the thin gap between the vibration-proof part 303a and the semiconductor chip 304 due to the surface tension of the vibration-proof part 303b. An MEMS structure serving as an angular velocity sensor and an MEMS structure serving as an acceleration sensor are formed on the semiconductor chip 304. A pad 305a formed on the semiconductor chip 304 is connected with a pad formed on the semiconductor chip 302 via, for example, metal wire 308a. Further, the pad 306b formed on the semiconductor chip 302 is connected with a terminal 307b formed on the packaging member 301 via metal wire 308c and also with a terminal 310 extending externally of the packaging member 301 via internal wiring within the packaging member 301. Still further, the semiconductor chips 102 and 104, which are stuck one upon another in the packaging member 301, are hermetically sealed in the packaging member 301 by hermetically covering the upper portion of the packaging member 301 with a lid 309.

Figure 9:
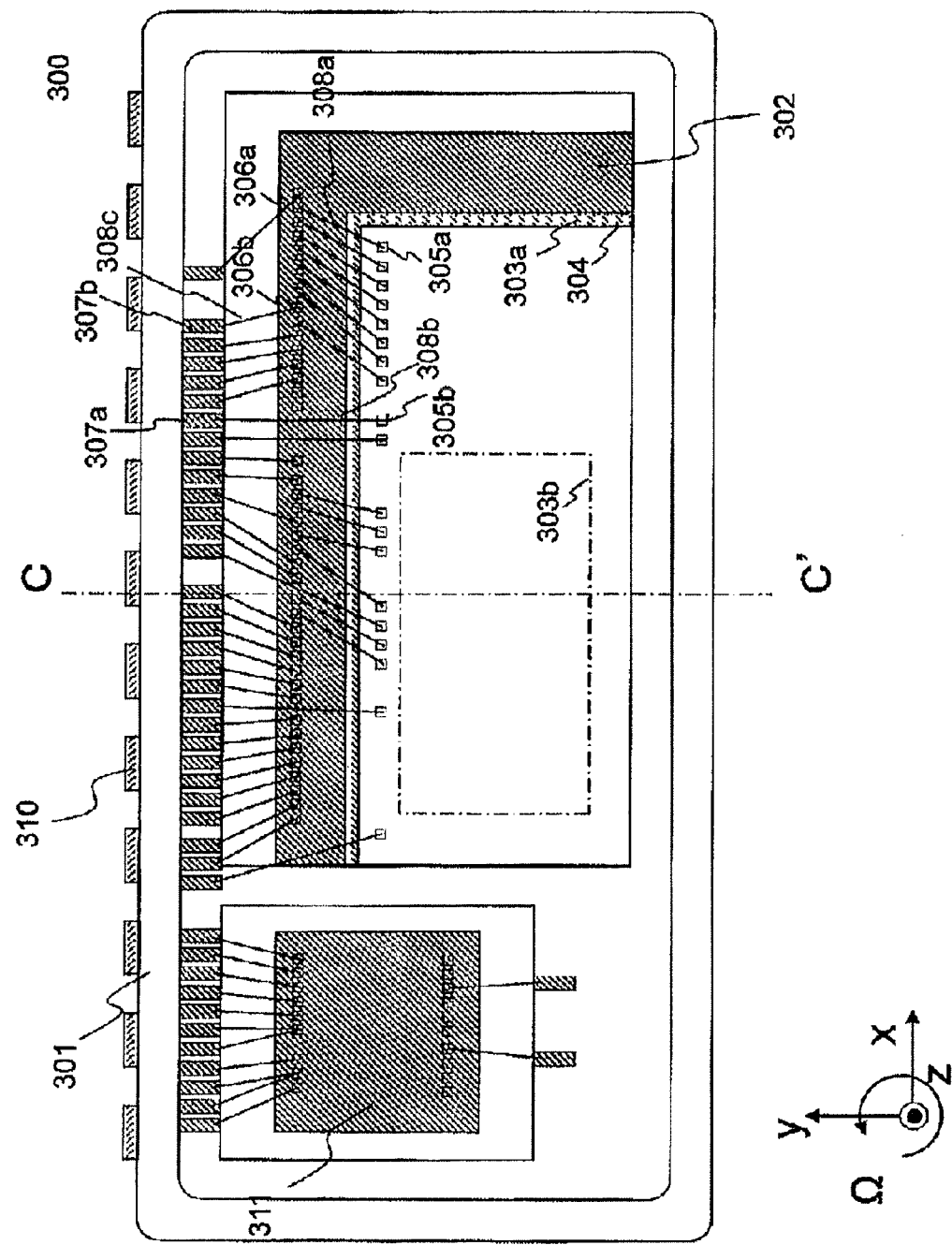
FIG. 9 shows in plan view the structure of a combined sensor in its mounted state, according to the second embodiment of this invention.

FIG. 9 shows in plan view the structure of the combined sensor in its mounted state, according to the second embodiment of this invention. The cross section taken along dashed line C-C in FIG. 9 corresponds to FIG. 8. The lid for hermetical sealing the packaging member is not shown in FIG. 9.

The semiconductor chip 302 for processing the signals from the angular velocity detecting unit and the acceleration detecting units of the compound sensor, and a semiconductor chip 311 for the step-up power supplied to the angular velocity detecting unit of the combined sensor, are mounted on the bottom of the hollow packaging member 301. The semiconductor chip 304 on which the MEMS structures serving as the detecting units of the combined sensor are formed, is mounted on the semiconductor chip 302 with the vibration-proof part 303a and the vibration-proof part 303b interposed between the semiconductor chips 302 and 304. The vibration-proof part 303a, formed as a frame surrounding the vibration-proof part 303b, is made of, for example, silicon rubber sheet. That part of the vibration-proof material 303b which is surrounded by the vibration-proof part 303a and is in contact with the semiconductor chip 304, is made of liquid having a high fluidity or its cured version such as, for example, silicon adhesive agent or silicon gel. It is to be noted here that since the vibration-proof part 303a serves as a frame for confining the material 303b of high fluidity, the material for the vibration-proof part 303a has a lager Young's modulus than that for the vibration-proof part 303b. The MEMS structure for detecting angular velocity and the MEMS structures for detecting accelerations are formed on the semiconductor chip 304.

The pad 305a formed on the semiconductor chip 304 is connected with the pad 306a formed on the semiconductor chip 302 via the metal wire 106a. Further, the pad 305b formed on the semiconductor chip 304 is connected with the terminal 307a formed on the packaging member 301 via the metal wire 308b and also with the terminal extending externally of the packaging member 301 via the internal wiring within the packaging member 301. Still further, the pad 306b formed on the semiconductor chip 302 is connected with the terminal 307b formed on the packaging member 301 via metal wire 308c and also with the terminal extending externally of the packaging member 301 via the internal wiring within the packaging member 301.

The semiconductor chip 302 for processing the signals from the angular velocity detecting unit and the acceleration detecting units of the compound sensor, the semiconductor chip 304 on which the MEMS structure as the detecting units of the combined sensor and the semiconductor chip 311 for the step-up power supplied to the angular velocity detecting unit of the combined sensor, all mounted on the bottom of the hollow packaging member 301, are hermetically sealed within the packaging member 301 by hermetically covering the upper portion of the packaging member 301 with a lid (not shown).

Figure 12:
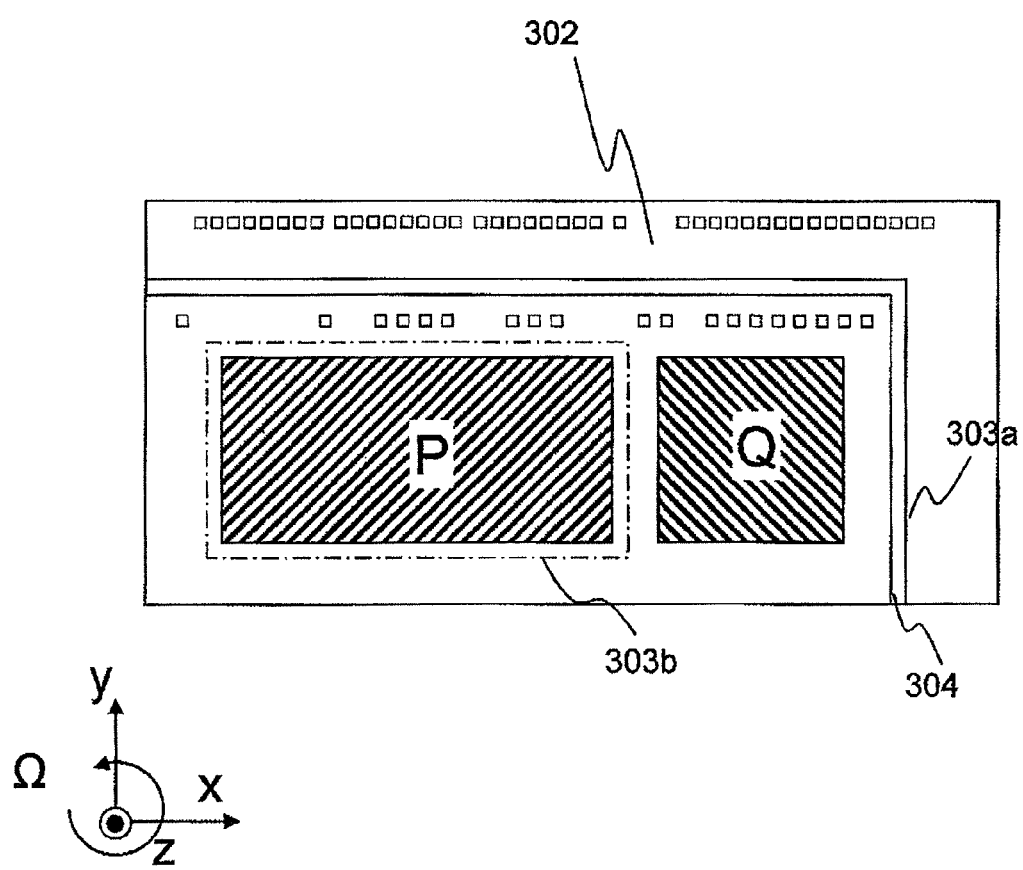
FIG. 12 shows in plan view the structure of a combined sensor in its mounted state, according to the second embodiment of this invention.
Figure 13:
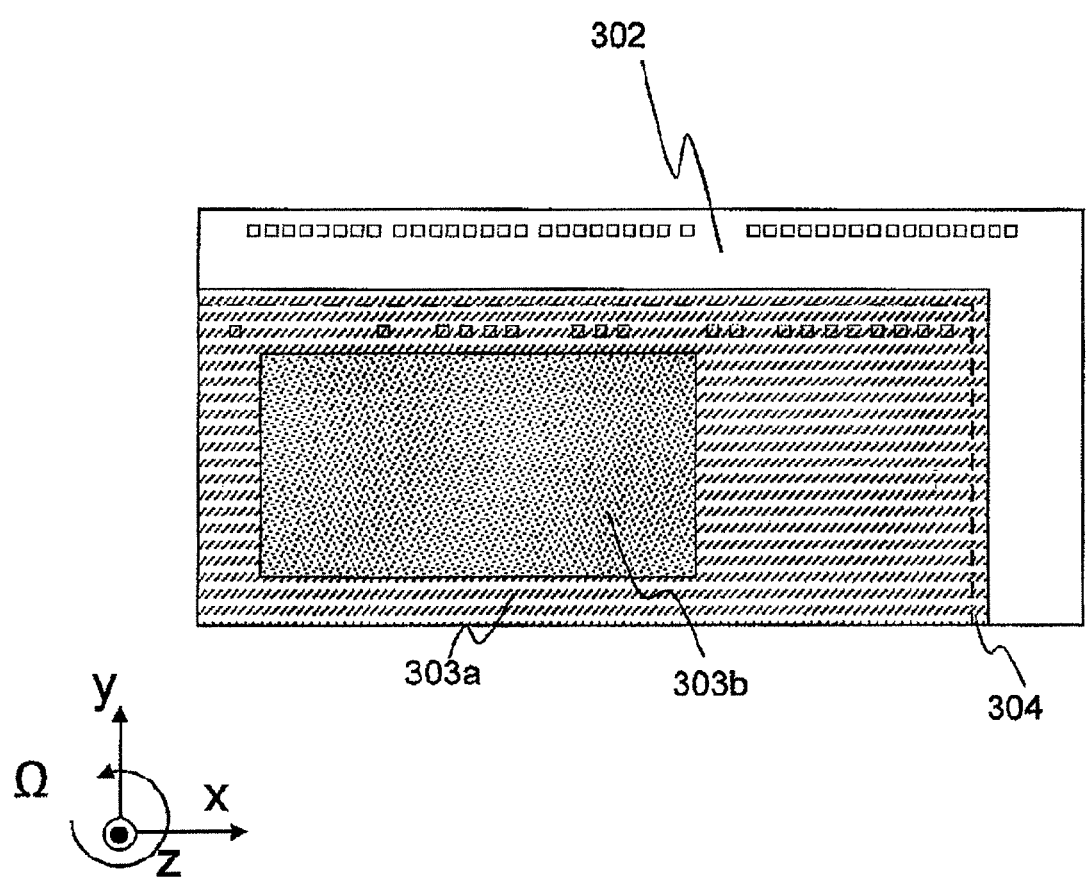
FIG. 13 shows in plan view the structure of a combined sensor in its mounted state, according to the second embodiment of this invention.

The shapes of the vibration-proof part 303a and the vibration-proof part 303b formed on the semiconductor chip 302 are shown as a box delineated with broken line in FIG. 9, FIG. 12 or FIG. 13. With respect to the pads 305a and 305b on the semiconductor chip 304, the frame of the vibration-proof part 303a extends perpendicular to the surface of the drawings. It is to be noted here that since the vibration-proof part 303a serves as a frame for confining the material 303b of high fluidity within, the material for the vibration-proof part 303a has a lager Young's modulus than that for the vibration-proof part 303b. With this structure, when wire bonding process for electric connection is performed after the semiconductor chips 302 and 304 have been mounted on the packaging member 301, the transfer of vibration, which is necessary for wire bonding, can be secured in the direction perpendicular to the surface of the drawing.

Figure 10:
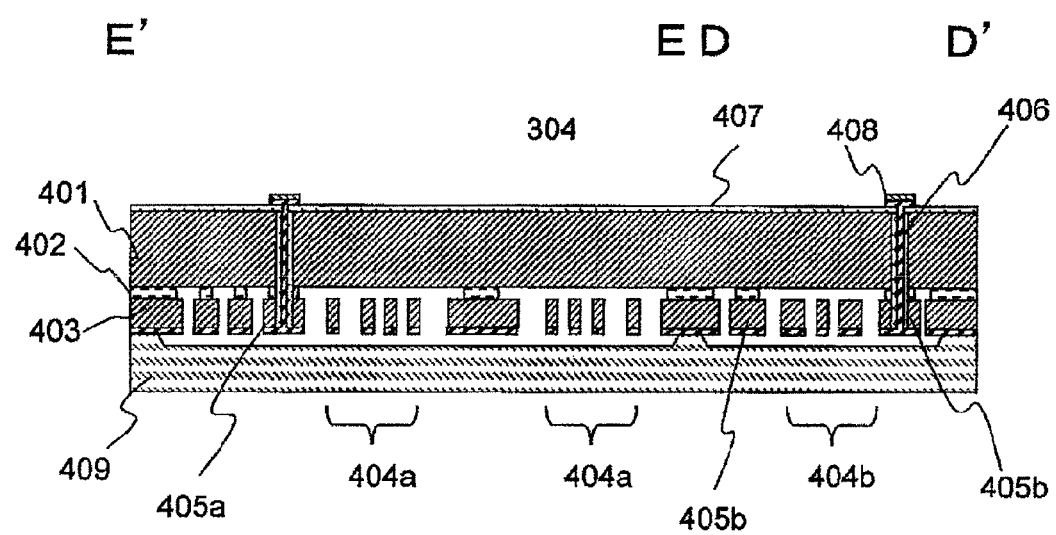
FIG. 10 shows in cross section the detection chip of the combined sensor according to the second embodiment of this invention.

FIG. 10 shows in cross section the details of the semiconductor chip 304 on which the MEMS structures for detecting single-axis angular velocity and two-axis accelerations respectively, are formed to realize a combined sensor as the second embodiment of this invention. In the semiconductor chip 104, angular velocity detecting movable parts 404a of the MEMS structure, angular velocity detecting fixed parts 405a of the MEMS structure, acceleration detecting movable parts 404b of the MEMS structure and acceleration detecting fixed parts 405b of the MEMS structure are formed on an SOI substrate constructed with a support substrate 401, an insulating oxide film 402 and a silicon activated layer 403, by using such techniques as photolithography and DRIE (Deep Reactive Ion Etching). And the angular velocity detecting movable parts 404a of the MEMS structure, the angular velocity detecting fixed parts 405a of the MEMS structure, the acceleration detecting movable parts 404b of the MEMS structure and the acceleration detecting fixed parts 405b of the MEMS structure are respectively protected in different spaces by a glass cap 409 joined to the silicon activated layer 403 by using such a technique as anodic junction or surface activation junction. Further, the angular velocity detecting movable parts 404a of the MEMS structure, the angular velocity detecting fixed parts 405a of the MEMS structure, the acceleration detecting movable parts 404b of the MEMS structure and the acceleration detecting fixed parts 405b of the MEMS structure are electrically connected with a pad 408 formed on the rear surface of the support substrate 401 via a penetration electrode material 406 that penetrates the support substrate 401, and further connected via bonding wire to an integrated circuit that has the function of processing the outputs of the detection units of the angular velocity sensor and the acceleration sensors, respectively.

Figure 11:
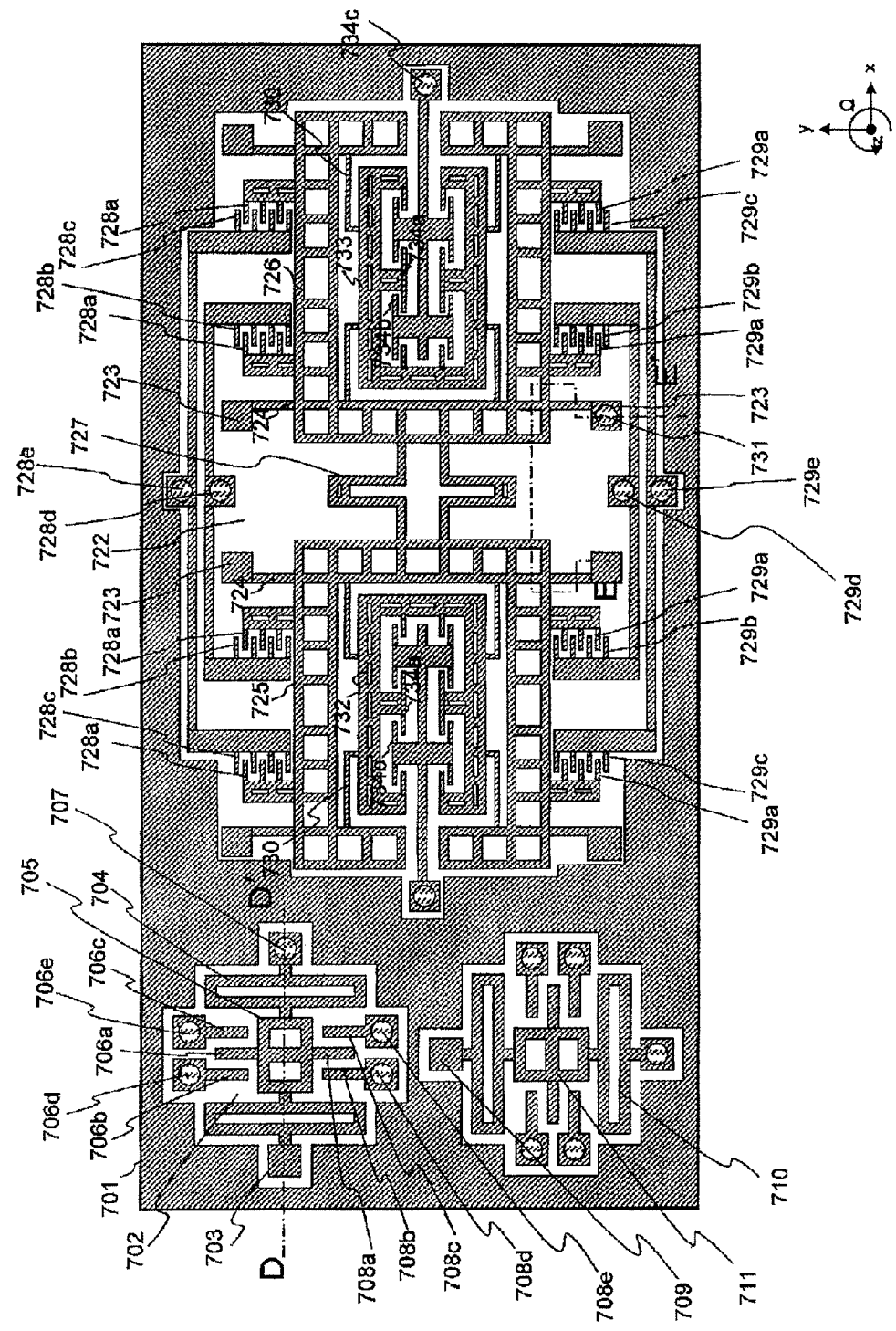
FIG. 11 shows in plan view the detection chip of the combined sensor according to the second embodiment of this invention.

FIG. 11 shows in plan view the details of the semiconductor chip 304 on which an angular velocity detecting MEMS structure for detecting single-axis angular velocity and an acceleration detecting MEMS structure for detecting two-axis accelerations, are formed to realize a combined sensor as the second embodiment of this invention. In this case, the plan view is meant to be the view taken of the MEMS structure from the side of the glass cap 409. Also, the cross sections along lines D-D' and E-E' in FIG. 11 correspond to FIG. 10.

The MEMS structure for detecting acceleration in the direction of the first axis (in the x-direction in FIG. 11) will be described below.

As shown in FIG. 11, a frame 701 is formed on the semiconductor chip 304 and the frame 701 surrounds a vacant space 702. In the vacant space 702 is provided a fixed part 703, which is mechanically coupled to a beam (elastically deformable part) 704 displaceable along the first axis (in the x-direction in FIG. 11). The beam 704 is in turn mechanically coupled to a movable part 705 that serves as a weight for the acceleration sensor. In fact, the fixed part 703 and the movable part 705 are coupled to each other via the elastically deformable beam 704 so that the movable part 704 can be displaced in the x-direction in FIG. 11.

A movable electrode 706a for detection is integrally formed with the movable part 705, and a fixed electrode 706b for detection and a fixed electrode 706c for detection are formed opposite to the movable electrode 706a for detection. The combination of the movable electrode 706a for detection and the fixed electrode 706b for detection or the combination of the movable electrode 706a for detection and the fixed electrode 706c for detection, constitutes a capacitive element. Accordingly, when the movable part 705 is displaced in the x-direction, the capacitance of the above mentioned capacitive element changes. In fact, the capacitive element comprising the combination of the movable electrode 706a for detection and the fixed electrode 706b for detection or the combination of the movable electrode 706a for detection and the fixed electrode 706c for detection, functions as a capacitance detecting unit that detects the displacement in the x-direction of the movable part 705 as a change in capacitance.

A movable electrode 708a for diagnosis is integrally formed with the movable part 705, and a fixed electrode 708b for diagnosis and a fixed electrode 708c for diagnosis are formed opposite to the movable electrode 708a for diagnosis. The combination of the movable electrode 708a for diagnosis and the fixed electrode 708b for diagnosis or the combination of the movable electrode 708a for diagnosis and the fixed electrode 708c for diagnosis, constitutes a capacitive element. When a diagnostic signal is applied between the movable electrode 708a for diagnosis and the fixed electrode 708b for diagnosis or between the movable electrode 708a for diagnosis and the fixed electrode 708c for diagnosis, which constitutes a capacitive element, electrostatic force is exerted between the movable electrode 708a for diagnosis and the fixed electrode 708b for diagnosis or between the movable electrode 708a for diagnosis and the fixed electrode 708c for diagnosis so that the movable electrode 708a for diagnosis is displaced. When the movable electrode 708a for diagnosis is displaced in the x-direction, the movable part 705 integrally formed with the movable electrode 708a for diagnosis is also displaced. In fact, the capacitive element made of the combination of the movable electrode 708a for diagnosis and the fixed electrode 708b for diagnosis or the combination of the movable electrode 708a for diagnosis and the fixed electrode 708c for diagnosis, functions as a forcible displacement generating unit for forcibly displacing the movable part in the x-direction.

Such an acceleration sensor structure as described above is made of semiconductor material like silicon. Accordingly, the fixed part 703 and the movable part 705, which are coupled to each other with the beam 704, are also connected electrically with each other, and the voltage applied to the movable part 705 is supplied from a penetration electrode 707 formed in the fixed part. On the other hand, penetration electrodes 706d and 706e are respectively formed in the fixed electrode 706b for detection and the fixed electrode 706c for detection. Accordingly, when capacitance change occurs due to the displacement in the x-direction of the movable part 705, electric charges flow into or out of the fixed electrode 706b for detection and the fixed electrode 706c for detection. In addition, penetration electrodes 708d and 708e are respectively formed in the fixed electrode 708b for diagnosis and the fixed electrode 708c for diagnosis so that diagnostic signals can be applied to the fixed electrode 708b for diagnosis and the fixed electrode 708c for diagnosis via the penetration electrodes 708d and 708e, respectively.

Further, on the semiconductor chip 304, an MEMS structure for detecting acceleration in the direction of a second axis (i.e. in the y-direction in FIG. 11), wherein a fixed part 709 is coupled to a beam (elastically deformable part) 710, to which a movable part 711 serving as the weight of an acceleration detecting unit is coupled, has the same structure as and is disposed in the 90 degrees rotated posture with respect to, the MEMS structure for detecting acceleration in the direction of the first axis (i.e. in the x-direction in FIG. 11).

As shown in FIG. 11, an angular velocity detecting MEMS structure for detecting angular velocity in the direction of a single axis is also formed on the semiconductor chip 304. Now, the structure of the angular velocity detecting unit will be described below.

The frame 701 which surrounds the above mentioned acceleration detecting MEMS structured also surrounds a vacant space 722, in which fixed parts 723 are disposed. The fixed parts 723 are coupled to beams (elastically deformable parts) 724, which are in turn coupled to movable parts 725 and 726 that are two vibration elements serving as two vibration weights of the angular velocity detection unit. In fact, the movable parts 725 and 726 that serve as two vibration elements are coupled to the fixed parts 723 via the elastically deformable beams 724 so that the movable parts 725 and 726 that serve as two vibration elements can be displaced in the x-direction in FIG. 11. Further, the movable parts 725 and 726 that serve as two vibration elements are coupled to each other via a link beam 727 so as to constitute a tuning fork vibration system for sharing vibration energies generated by the vibration elements.

Driving movable electrodes 728a are formed integrally with the movable parts 725 and 726 serving as the vibratory elements, and driving fixed electrodes 728b and 728c are disposed opposite to the driving movable electrodes 228a. A periodic driving signal represented by Vcom+Vb+Vd is applied between the driving movable electrodes 728a and the driving fixed electrodes 728b, which are disposed opposite to each other to form capacitive elements; a periodic driving voltage represented by Vcom+Vb−Vd is applied between the driving movable electrodes 728a and the driving fixed electrodes 728c; and a voltage Vcom is applied via a common electrode 731 to the movable parts 725 and 726 which constitute vibrating elements. Accordingly, since electrostatic force is generated between the driving movable electrodes 728a and the driving fixed electrodes 728b and between the driving movable electrodes 728a and the driving fixed electrodes 728c, then the driving movable electrodes 728a are brought to vibration. When the driving movable electrodes 728a vibrate in the direction of the x-axis, the movable parts 725 and 726, which are formed integrally with the driving movable electrodes 728a and serve as the vibrating elements, vibrate in opposite phase. That is to say, the capacitive elements made of the driving movable electrodes 728a and the driving fixed electrodes 728b or of the driving movable electrodes 728a and the driving fixed electrodes 728c function as forced vibration generating units that cause the movable parts 725 and 726 serving as vibrating elements to be forcibly vibrated in opposite phases in the direction of the x-axis.

Drive amplitude monitoring movable electrodes 729a are formed integrally with the movable parts 725 and 726 serving as vibrating elements, and drive amplitude monitoring fixed electrodes 729b and 729c are formed opposite to the drive amplitude monitoring movable electrodes 229a. The combination of the drive amplitude monitoring movable electrodes 729a and the drive amplitude monitoring fixed electrodes 729b and the combination of the drive amplitude monitoring movable electrodes 729a and the drive amplitude monitoring fixed electrodes 729c, form capacitive elements respectively. When the movable parts 725 and 726 serving as vibrating elements are displaced in the direction of the x-axis due to electrostatic forces acting between the driving movable electrodes 728a and the driving fixed electrodes 728b and between the driving movable electrodes 728a and the driving fixed electrodes 728c, the capacitances of the capacitive elements are changed. In fact, the capacitive elements constructed with the drive amplitude monitoring movable electrodes 729a and the drive amplitude monitoring fixed electrodes 729b and with the drive amplitude monitoring movable electrodes 729a and the drive amplitude monitoring fixed electrodes 729c, function as capacitance detecting units for detecting the displacement in the x-direction of the movable parts 725 and 726 serving as vibrating elements as changes in capacitance.

The movable parts 725 and 726 serving as vibrating elements are mechanically coupled via beams 730 to movable parts 732 and 733 serving as detecting elements, respectively. Angular velocity detecting movable electrodes 734a are formed integrally with the movable parts 732 and 733 serving as detecting elements, and angular velocity detecting fixed electrodes 734b are formed opposite to the angular velocity detecting movable electrodes 734a. These angular velocity detecting movable electrodes 734a and angular velocity detecting fixed electrodes 734b form capacitive elements. When the substrate as a whole is rotated about the z-axis perpendicular to the substrate, the Coriolis force whose magnitude depends on the generated rotational force causes the movable parts 732 and 733 serving as detecting elements to be displaced in the y-direction so that the capacitances of the above mentioned capacitive elements change accordingly. In fact, the capacitive elements constructed with the angular velocity detecting movable electrodes 734a and angular velocity detecting fixed electrodes 734b function as capacitance detecting units for detecting the displacement in the y-direction of the movable parts 732 and 733 serving as detecting elements as change in capacitance.

The capacitance changes occurring in the respective electrode pairs is electrically transferred to the rear surface of the semiconductor chip 304 via penetration electrodes 728d, 728e, 729d, 729e, 731 and 734c, and further transferred via bonding wires to the integrated circuit which has the function of processing the output of the angular velocity detecting unit.

It is to be noted here that although the semiconductor chip 304 was supposed to be fabricated by using an SOI substrate and such techniques as photolithography and DRIE (Deep Reactive Ion Etching), the semiconductor chip 304 can also be fabricated by the bulk MEMS process which forms MEMS structures by working on both sides of a silicon substrate through the use of techniques for joining glass and silicon, and hence making a glass-silicon-glass junction. Further, the semiconductor chip 304 can also be fabricated by the surface MEMS process in which an MEMS structure is formed by depositing thin films on the surface of a silicon substrate on which signal processing circuits including transistors are previously formed, and by repeating the patterning of the deposited thin films.

Furthermore, the MEMS structure for detecting angular velocity is formed in that part of the area on the semiconductor chip 304 which is indicated at P in FIG. 12 while the MEMS structure for detecting acceleration is formed in that part of the area on the semiconductor chip 304 which is indicated at Q in FIG. 12.

In this way, the compound sensor as an inertia sensor according to the second embodiment of this invention is mounted on the semiconductor chip.

As for the angular velocity sensor unit of the combined sensor according to the second embodiment of this invention, when the substrate as a whole is rotated about the third axis perpendicular to the substrate with respect to the semiconductor chip on which the angular velocity detecting unit in the form of the MEMS structure is formed, the Coriolis force whose magnitude depends on the generated rotational force causes the weight vibrating in the direction of the first axis (i.e. in the x-direction in FIG. 9) to be displaced in the direction of the second axis (i.e. in the y-direction in FIG. 9). The displacement of the weight is transferred as an electric signal to the semiconductor chip 302, the transferred signal is processed by the integrated circuit formed in the semiconductor chip 302, and finally an angular velocity signal is delivered.

With the above described angular velocity sensor, except when a rotational force is applied to the semiconductor chip 304 on which the angular velocity detecting unit in the form of the MEMS structure is formed and even when acceleration is applied in the direction of the second axis (i.e. in the y-direction in FIG. 9), the weight vibrating in the direction of the first axis (i.e. in the x-direction in FIG. 9) due to this acceleration is caused to be displaced in the direction of the second axis (i.e. in the y-direction in FIG. 9). Then, the displacement of the weight is transferred as an electric signal to the semiconductor chip 302, and the transferred signal is processed by the integrated circuit formed in the semiconductor chip 302. That is to say, even when the sensor substrate as a whole is not rotated about the third axis perpendicular to the sensor substrate, the angular velocity sensor unit detects the displacement of the weight as caused by the acceleration if any acceleration is applied in the direction of the second axis (i.e. in the y-direction in FIG. 9). In this way, when acceleration is applied in the direction of the second axis (i.e. in the y-direction in FIG. 9) with respect to the substrate of the angular velocity sensor, the displacement of the weight as caused by the acceleration is included as noise so that the precision in detecting angular velocity is thought to be degraded.

Figure 14:
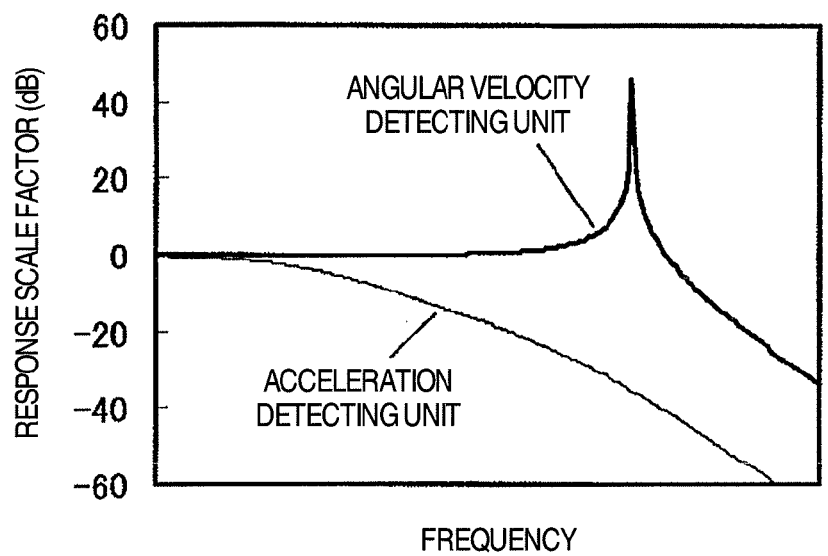
FIG. 14 shows the frequency response with respect to the detection unit of the combined sensor according to the second embodiment of this invention.

Further, of the combined sensor as the second embodiment of this invention, the acceleration sensor unit for detecting acceleration in the direction of the first axis (i.e. in the x-direction in FIG. 9) has the weight supported by the support beam displaceable in the direction of the first axis (i.e. in the x-direction in FIG. 9) with respect to the semiconductor chip 304 on which the acceleration detecting unit is formed, the weight being displaced in the direction of the first axis (i.e. in the x-direction in FIG. 9) due to the acceleration in the direction of the first axis (i.e. in the x-direction in FIG. 9). The displacement of the weight is then transferred as an electric signal to the semiconductor chip 302, the integrated circuit formed on the semiconductor chip 302 performs signal processing such that only signals having frequencies of 0~several tens of Hz, which are required for measurement, are delivered, and finally a signal representing the acceleration in the direction of the first axis (i.e. in the x-direction in FIG. 9) is outputted. Accordingly, in the acceleration sensor unit for detecting acceleration in the direction of the first axis (i.e. in the x-direction in FIG. 9), if acceleration having a range of frequencies higher than 0~several tens of Hz, which are required for measurement, but lower than the mechanical response frequencies of the structure as the acceleration detecting unit for detecting acceleration in the direction of the first axis (i.e. in the x-direction in FIG. 9), which includes the above mentioned weight and the support beam displaceable in the direction of the first axis (i.e. in the x-direction in FIG. 9), is applied to the semiconductor chip 304 on which the acceleration detecting unit in the form of the MEMS structure is formed, then the weight is displaced in the direction of the first axis (i.e. in the x-direction in FIG. 9) in which it is displaceable, and the displacement of the weight is converted to an electric signal by means of an LSI circuit. If the electric signal obtained by converting the displacement of the weight at this time exceeds the range of signal amplitudes which the LSI circuit can handle, that is, if the LSI circuit suffers signal saturation, the acceleration in the direction of the first axis (i.e. in the x-direction in FIG. 9) having frequencies of 0~several tens of Hz, which is originally intended to be measured, is buried in the saturation signal. Accordingly, the acceleration in the direction of the first axis (i.e. in the x-direction in FIG. 9) cannot be properly outputted. This gives rise to a problem that the function of detecting acceleration is disrupted. It is to be noted here that the magnitude and the frequency range of such input acceleration causing the weight displacement beyond the signal range that the LSI circuit can handle, can be calculated according to the frequency response characteristic of the MEMS structure as the acceleration detecting unit shown in FIG. 14. If the frequency range of the input acceleration is low, the response scale factor of the MEMS structure as the acceleration detecting unit is near 0 dB (=1). Accordingly, the magnitude of the acceleration that causes the weight displacement beyond the signal range that the LSI circuit can handle, is of the same order as the full scale range in the acceleration calculation within the LSI circuit. However, if the frequency range of the input acceleration is high, the response scale factor of the MEMS structure as the acceleration detecting unit becomes small. Accordingly, the magnitude of the acceleration that causes the weight displacement beyond the signal range that the LSI circuit can handle, can be made larger than the full scale range in the acceleration calculation within the LSI circuit. To be concrete, for the frequencies for which the response scale factor of the MEMS structure as the acceleration detecting unit is −20 dB, acceleration input can be made 10 times as large as the full scale range in the acceleration calculation within the LSI circuit.

Further, of the combined sensor as the second embodiment of this invention, the acceleration sensor unit for detecting acceleration in the direction of the second axis (i.e. in the y-direction in FIG. 9) has the weight supported by the support beam displaceable in the direction of the second axis (i.e. in the y-direction in FIG. 9) with respect to the semiconductor chip 304 on which the acceleration detecting unit is formed, the weight being displaced in the direction of the second axis (i.e. in the y-direction in FIG. 9) due to the acceleration in the direction of the second axis (i.e. in the y-direction in FIG. 9). The displacement of the weight is then transferred as an electric signal to the semiconductor chip 302, the integrated circuit formed on the semiconductor chip 302 performs signal processing such that only signals having frequencies of 0~several tens of Hz, which are required for measurement, are delivered, and finally a signal representing the acceleration in the direction of the second axis (i.e. in the y-direction in FIG. 9) is outputted.

Accordingly, in the acceleration sensor unit for detecting acceleration in the direction of the second axis (i.e. in the y-direction in FIG. 9), if acceleration having a range of frequencies higher than 0~several tens of Hz, which are required for measurement, but lower than the mechanical response frequency of the structure of the acceleration detecting unit for detecting acceleration in the direction of the second axis (i.e. in the y-direction in FIG. 9), which includes the above mentioned weight and the support beam displaceable in the direction of the first axis (i.e. in the x-direction in FIG. 9), is applied to the semiconductor chip 304 on which the acceleration detecting unit in the form of the MEMS structure is formed, the weight is displaced in the direction of the second axis (i.e. in the y-direction in FIG. 9) in which it is displaceable. And the displacement of the weight is converted to an electric signal by means of an LSI circuit. If the electric signal obtained by converting the displacement of the weight at this time exceeds the range of signal amplitudes which the LSI circuit can handle, that is, if the LSI circuit suffers signal saturation, the acceleration in the direction of the second axis (i.e. in the y-direction in FIG. 9) having frequencies of 0~several tens of Hz, which is originally intended to be measured, is buried in the saturation signal. Accordingly, the acceleration in the direction of the second axis (i.e. in the y-direction in FIG. 9) cannot be properly outputted. This gives rise to a problem that the function of detecting acceleration is disrupted.

However, the combined sensor as the second embodiment of this invention has the structure wherein the vibration-proof part 303a, the vibration-proof part 303b, the angular velocity detecting unit as the MEMS structure, the acceleration detecting unit as the MEMS structure for detecting acceleration in the direction of the first axis and the acceleration detecting unit as the MEMS structure for detecting acceleration in the direction of the second axis, all having shapes as shown in FIG. 13, are formed on the semiconductor chip 304. The vibration transmissibilities at some points in the structure wherein the vibration-proof part 303a, the vibration-proof part 303b, the angular velocity detecting unit as the MEMS structure, the acceleration detecting unit as the MEMS structure for detecting acceleration in the direction of the first axis and the acceleration detecting unit as the MEMS structure for detecting acceleration in the direction of the second axis, all having shapes as shown in FIG. 13, are formed on the semiconductor chip 304, can be calculated through structural computations using the finite element method.

Figure 15:
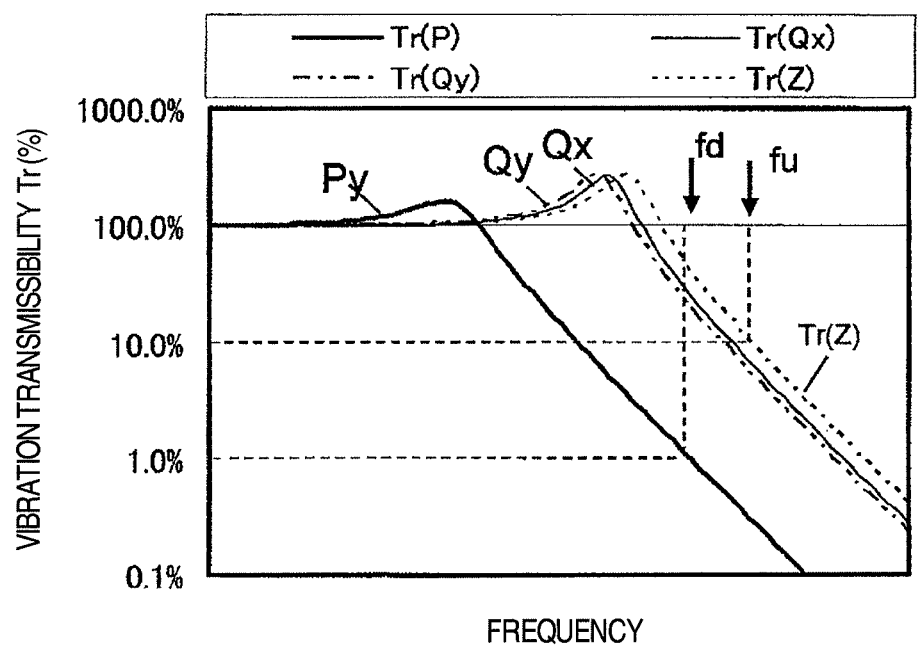
FIG. 15 shows the vibration transmissibility in the combined sensor according to the first embodiment of this invention.

Let the semiconductor chip 104 configured with a silicon substrate have its areal dimensions of 4 mm×9 mm and its thickness of 0.5 mm, and let the vibration-proof part 303a be made of silicon rubber sheet having its Young's modulus of 5 MPa (Hardness 40) and the vibration-proof part 303b be made of silicon gel having its Young's modulus of 0.1 MPa. Then the vibration transmissibility in the direction of the second axis (i.e. in the y-direction in FIG. 9) in the region indicated at P in FIG. 12 of the semiconductor chip 304, corresponds to the frequency characteristic represented at Py in FIG. 15; the vibration transmissibility in the direction of the first axis (i.e. in the x-direction in FIG. 9) in the region indicated at Q in FIG. 12 of the semiconductor chip 304, corresponds to the frequency characteristic represented at Qx in FIG. 15; and the vibration transmissibility in the direction of the second axis (i.e. in the y-direction in FIG. 9) in the region indicated at P in FIG. 12 of the semiconductor chip 304, corresponds to the frequency characteristic represented at Qy in FIG. 15. It is to be noted here that if the frequency detected by the angular velocity detecting units in the form of the MEMS structure is assumed to be fd, the vibration transmissibility of the structure is obtained by adjusting the thicknesses of the vibration-proof parts 303a and 303b in such a manner that the vibration transmissibility in the second axis (in the y-direction in FIG. 9) along which detection takes place, at the frequency fd meets a desired target value.

Therefore, if use is made of the structure wherein the vibration-proof part 303a, the vibration-proof part 303b, the angular velocity detecting unit as the MEMS structure, the acceleration detecting unit as the MEMS structure for detecting acceleration in the direction of the first axis and the acceleration detecting unit as the MEMS structure for detecting acceleration in the direction of the second axis, all having shapes as shown in FIG. 13, are formed on the semiconductor chip 304, then while the vibration transmissibility can be set low in the direction of the second axis (i.e. in the y-direction in FIG. 9) in the region where the angular velocity detecting unit is formed on the semiconductor chip 304 and which is indicated at P in FIG. 12, the vibration transmissibility in the axial direction other than the y-direction can be prevented from being lowered. Further, the vibration transmissibility in the direction of the first axis (i.e. in the x-direction in FIG. 9) in the region where the acceleration detecting unit is formed on the semiconductor chip 304 and which is indicated at Q in FIG. 12, can be set to be 100% at most for the frequency range for which the response scale factor of the MEMS structure serving as the acceleration detecting unit is nearly equal to 0 dB (=1). Moreover, the vibration transmissibility in the direction of the second axis (i.e. in the y-direction in FIG. 9) in the region where the acceleration detecting unit is formed on the semiconductor chip 304 and which is indicated at Q in FIG. 12, can be set to be 100% at most for the frequency range for which the response scale factor of the MEMS structure serving as the acceleration detecting unit is nearly equal to 0 dB (=1). Furthermore, let the frequency of ultrasonic vibration used in the wire bonding process for obtaining electric connection after the semiconductor chip 302 or the semiconductor chip 304 has been mounted on the packaging member 301, be fu. Then the vibration transmissibility in the z-direction can be secured.

As described above, since the combined sensor as the inertia sensor of the second embodiment of this invention has the vibration-proof part 303a and the vibration-proof part 303b as shown in FIG. 13, then even if accelerating vibration unnecessary for measurement is applied to the combined sensor as a whole, this structure can prevent the accelerating vibration from being transmitted to the substrate 304 in which the angular velocity detecting unit in the form of the MEMS structure and the acceleration detecting units in the form of the MEMS structure are formed, so that the combined sensor can be prevented from suffering the degradation of output precision and the functional disruption due to erroneous outputs. It is to be noted here that although this embodiment included two acceleration detecting sensors, one for detecting acceleration in the x-direction and the other for detecting acceleration in the y-direction, the provision of at least one angular velocity detecting sensor and one acceleration sensor for detecting acceleration in one of the two directions (e.g. in the x-direction) is enough for the structure of a combined sensor. And that simplified sort of combined sensor can achieve such effects as enjoyed by this embodiment.

As described above, this embodiment of the invention: a packaging member (301); a substrate (401); a semiconductor chip (304) including a first sensor unit (angular velocity detecting unit) formed on the substrate for outputting a first electric signal and a second sensor unit (e.g. acceleration detecting unit for the x-direction) formed on the substrate for outputting a second electric signal; a semiconductor chip (302) including a computing circuit for performing arithmetic operation on the first electric signal and the second electric signal; and a vibration-proof structure disposed between the semiconductor chips and including a first vibration-proof part (303b) and a second vibration-proof part (303a) which has a larger Young's modulus than the first vibration-proof part, wherein the first sensor unit includes a first weight that can vibrate in a first direction parallel to the surface of the substrate, and a first detecting electrode for converting the displacement of the first weight in a second direction to a first electric signal when the substrate is rotated about a third direction along an axis perpendicular to the surface of the substrate, the second direction being parallel to the surface of the substrate and perpendicular to the first direction; the second weight that can vibrate in the first direction and a second detecting electrode for converting the displacement of the second weight in the first direction to a second electric signal when acceleration is applied in the first direction; and the periphery of the first vibration-proof part is surrounded by the second vibration-proof part or the combination of the second vibration-proof part and the packaging substrate. According to this embodiment, since the vibration-proof structure is made of such a soft, hard-to-handle material having a low Young's modulus as silicon adhesive agent or gel that has fluidity before curing, convenience in mounting can be enhanced and the vibration transmissibility of the vibration-proof structure can be lowered even in the limited space in the packaging member. In addition, the vibration-proof structure is characterized in that at least one of the characteristic vibration frequency in the first direction and the characteristic vibration frequency in the second direction is made different in the first sensor unit and the second sensor unit. It is a matter of course that the characteristic vibration frequencies in both the first and second directions can be made different from each other. These features can realize suitable frequency characteristics in different inertia sensors (e.g. angular velocity sensor and acceleration sensor) in a combined sensor, and therefore make it possible to even lower the vibration transmissibility for each sensor.

By using such a geometrical relationship that the projection of the bonding pad in the direction perpendicular to the surface of the substrate falls on the second vibration-proof part, ultrasonic vibration required for electrically connecting the semiconductor chip 304 and the signal processing semiconductor chip 302 through wire bonding can be transmitted while the vibration transmissibility of the vibration-proof structure is lowered. Thus, convenience in mounting can be secured. This fact is the same as in the first embodiment.

Figure 16:
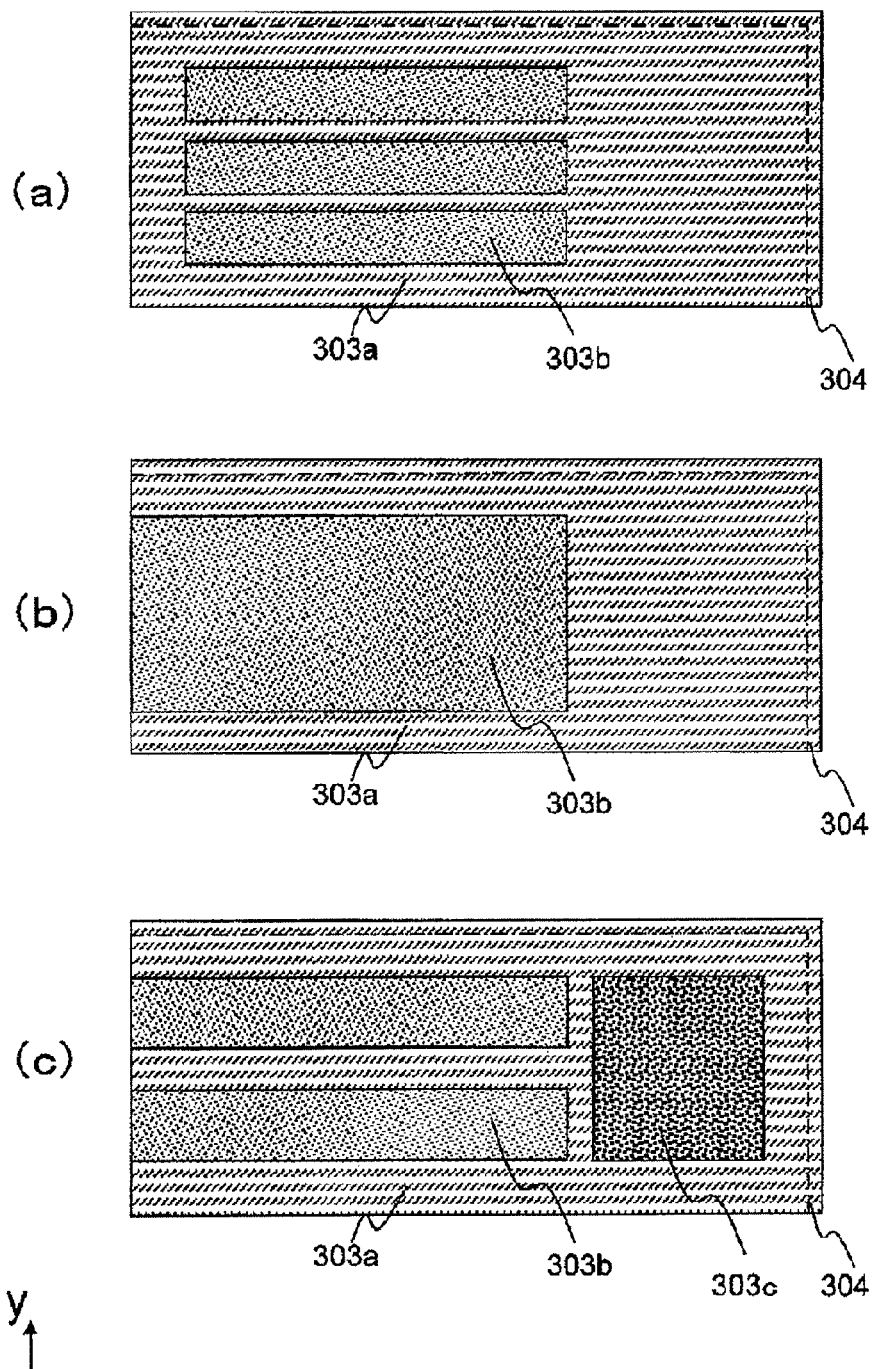
FIG. 16 shows in plan view the structure of a combined sensor in its mounted state, according to the second embodiment of this invention.

The structure in which the hard vibration-proof part 303a having a large Young's modulus surrounds the soft vibration-proof part 303b having a small Young's modulus, is not limited to that shown in FIG. 13, but the structures shown in Parts (a)~(c) of FIG. 16 can also be adopted to achieve effective vibration-proof characteristics. This fact is also the same as in the first embodiment. That is to say, the first vibration-proof part has only to be surrounded by the second vibration-proof part or the combination of the second vibration-proof part and the packaging member. This structure makes the above mentioned enhancements of both precision and convenience in mounting compatible with each other. In addition, the structures shown in Parts (a)~(b) of FIG. 16 can achieve such unique effects as cannot be attained by the structure shown in FIG. 13. The unique effects are the same as those achieved by the corresponding structures shown in Parts (a)~(b) of FIG. 7.

The structure shown in Part (c) of FIG. 16 is provided with the third vibration-proof part having a Young's modulus that differs from those of the first vibration-proof part 303a and the second vibration-proof part 303b. Therefore, the structure shown in Part (c) of FIG. 16 can achieve such a unique effect as cannot be attained by the structure shown in FIG. 13. The unique effect corresponds to that achieved by the structure shown in Part (c) of FIG. 7, and, in addition to this, the effect can be obtained that the vibration transmissibility in the direction of the first axis (i.e. in the x-direction in FIG. 9) in the region indicated at Q on the semiconductor chip 304 in FIG. 12 and the vibration transmissibility in the direction of the second axis (i.e. in the y-direction in FIG. 9) in the region indicated at Q on the semiconductor chip 304 in FIG. 12, can be easily adjusted. For example, if a third vibration-proof part is formed with material having a Young's modulus larger than those of the first vibration-proof part (303b) and the second vibration-proof part (303a) so that the difference in vibration transmissibility between the angular velocity detecting unit and the acceleration detecting unit is made large, then sensor precision can further be enhanced.

If the above described structures are employed, vibration-proof structures adapted for the mechanical characteristics of the MEMS structures serving as an angular velocity sensor and as an acceleration sensor can be provided even for a combined sensor chip wherein the angular velocity sensor and the acceleration, sensor whose mechanical frequency responses of the respective MEMS structures are different from each other, are mounted together on the sensor chip.

REFERENCE SIGNS LIST 100 sensor
101 packaging member
102 semiconductor chip
103a vibration-proof part
103b vibration-proof part
104 semiconductor chip
105a pad
105b pad
106a wire
106b wire
107 terminal
108 terminal
109 lid
110 pad
300 sensor
301 packaging member
302 semiconductor chip
303a vibration-proof part
303b vibration-proof part
303c vibration-proof part
304 semiconductor chip
305a pad
305b pad
306a pad
306b pad
307a terminal
307b terminal
308a wire
308b wire
308c wire
309 lid
310 terminal

The invention claimed is:
1. An inertia sensor comprising:
a packaging member;

a first semiconductor chip having a substrate and a detecting unit of the sensor comprising weights displaceable relative to the substrate and detecting electrodes for converting displacements of the weights to electric signals, the detecting unit of the sensor being mounted on the substrate;

a second semiconductor chip mounted on the packaging member so as to perform arithmetic operations based on the electric signals; and a vibration-proof structure having a first vibration-proof part and a second vibration-proof part made of material having a larger Young's modulus than the first vibration-proof part, the vibration-proof structure being disposed between the first semiconductor chip and the second semiconductor chip, wherein a periphery of the first vibration-proof part is surrounded by the second vibration-proof part or a combination of the second vibration-proof part and the packaging member; and wherein one portion of the periphery of the first vibration-proof part is in contact with the packaging member while another portion of the periphery of the first vibration-proof part is surrounded by the second vibration-proof part.

2. The inertia sensor according to claim 1, further comprising bonding pads to which wires for transmitting the electric signals to the second semiconductor chip are connected, and a projection of the bonding pads in a direction perpendicular to the surface of the substrate falls on a second vibration-proof part.

3. The inertia sensor according to claim 1, wherein the first and second vibration-proof parts are formed in such a manner that a characteristic frequency in the first direction parallel to the surface of the substrate and a characteristic frequency in the second direction parallel to the surface of the substrate and perpendicular to the first direction are different from each other.

4. The inertia sensor according to claim 3, wherein the first vibration-proof part has a shape of a rectangle having its long side in a first direction and its short side in a second direction.

5. The inertia sensor according to claim 1, wherein the first vibration-proof part is divided into a plurality of sub-parts by the second vibration-proof part.

6. The inertia sensor according to claim 1, wherein the characteristic frequency in the first direction parallel to the surface of the substrate and the characteristic frequency in the second direction parallel to the surface of the substrate and perpendicular to the first direction are different from each other in the structure including the vibration-proof structure and the detecting unit of sensor.

7. An inertia sensor comprising:
a packaging member;
a first semiconductor chip including a substrate, a first sensor unit formed on the substrate for outputting a first electric signal and a second sensor unit formed on the substrate for outputting a second electric signal;
a second semiconductor chip including a computing circuit for performing arithmetic operation on the first electric signal and the second electric signal; and
a vibration-proof structure disposed between the first and second semiconductor chips and including a first vibration-proof part and a second vibration-proof part which has a larger Young's modulus than the first vibration-proof part,
wherein the first sensor unit includes:

a first weight that can vibrate in a first direction parallel to a surface of the substrate; and a first detecting electrode for converting a displacement of the first weight in a second direction to the first electric signal when the substrate is rotated about a third direction along an axis perpendicular to the surface of the substrate, the second direction being parallel to the surface of the substrate and perpendicular to the first direction;

wherein the second sensor unit includes:
a second weight that can vibrate in the first direction; and
a second detecting electrode for converting the displacement of the second weight in the first direction to a second electric signal when acceleration is applied in the first direction;

wherein a periphery of the first vibration-proof part is surrounded by the second vibration-proof part or the combination of the second vibration-proof part and the packaging substrate; and wherein the structure including the first vibration-proof part and the second vibration-proof part is such that the characteristic frequency in the first direction or the characteristic frequency in the second direction is different in the first sensor and the second sensor.

8. The inertia sensor according to claim 7, wherein the first semiconductor chip further comprises first bonding pads to which first wires for transmitting the first electric signal to the second semiconductor chip are connected and second bonding pads to which second wires for transmitting the second electric signal to the second semiconductor chip are connected; and the projections of the first and second bonding pads in the direction perpendicular to the surface of the substrate fall on the second vibration-proof part.

9. The inertia sensor according to claim 7, further comprising a third detecting unit of sensor disposed on the substrate for delivering a third electric signal, wherein a third detecting unit of sensor includes a third weight for vibrating in the second direction and a third detecting electrode for converting the displacement of the third weight in the second direction to a third electric signal when acceleration is applied in the second direction.

10. The inertia sensor according to claim 7, wherein the vibration transmissibilities in the positions of the first and second weights in the vibration-proof structure are different from each other.

11. The inertia sensor according to claim 7, wherein the characteristic frequencies in the first and second directions of the structure comprising the first vibration-proof part and the second vibration-proof part are different from each other.

12. The inertia sensor according to claim 11, wherein the first vibration-proof part has a shape of a rectangle having its long side in the first direction and its short side in the second direction.

13. The inertia sensor according to claim 7, wherein the first vibration-proof part is divided into a plurality of sub-parts by the second vibration-proof part.

14. The inertia sensor according to claim 7, wherein the one portion of the periphery of the first vibration-proof part is in contact with the packaging member while the other portion of the periphery of the first vibration-proof part is surrounded by the second vibration-proof part.

* * * * *